(12) United States Patent
Ogiwara et al.

(10) Patent No.: US 10,290,545 B2
(45) Date of Patent: May 14, 2019

(54) LASER PROCESSING METHOD

(71) Applicant: HAMAMATSU PHOTONICS K.K., Hamamatsu-shi, Shizuoka (JP)

(72) Inventors: Takafumi Ogiwara, Hamamatsu (JP); Yuta Kondoh, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/763,605

(22) PCT Filed: Aug. 8, 2016

(86) PCT No.: PCT/JP2016/073355
§ 371 (c)(1),
(2) Date: Mar. 27, 2018

(87) PCT Pub. No.: WO2017/056739
PCT Pub. Date: Apr. 6, 2017

(65) Prior Publication Data
US 2018/0294189 A1    Oct. 11, 2018

(30) Foreign Application Priority Data
Sep. 29, 2015   (JP) ................................. 2015-191095

(51) Int. Cl.
*H01L 21/78*   (2006.01)
*B23K 26/046*  (2014.01)
(Continued)

(52) U.S. Cl.
CPC ............ *H01L 21/78* (2013.01); *B23K 26/046* (2013.01); *B23K 26/53* (2015.10); *H01L 21/02* (2013.01);
(Continued)

(58) Field of Classification Search
CPC ..... H01L 21/78; H01L 21/304; H01L 21/268; H01L 21/6836
See application file for complete search history.

(56) References Cited

FOREIGN PATENT DOCUMENTS

JP    2009-124077 A    6/2009
JP    2013-89714 A     5/2013
(Continued)

OTHER PUBLICATIONS

International Preliminary Report on Patentability dated Apr. 12, 2018 for PCT/JP2016/073355.

*Primary Examiner* — Anthony Ho
(74) *Attorney, Agent, or Firm* — Drinker Biddle & Reath LLP

(57) ABSTRACT

Laser light is converged at an object including a semiconductor substrate formed with a plurality of functional devices on a front surface, from a back surface of the semiconductor substrate, and while a distance between the front surface and a first converging point of the laser light is maintained at a first distance, whereby a first modified region is formed along the line. The laser light is converged at the object from the back surface, and while a distance between the front surface and a second converging point is maintained at a second distance, and while the second converging point is offset with respect to a position at which the first converging point is converged, whereby a second modified region is formed along the line. A predetermined portion including the back surface and at least the second modified region is removed.

16 Claims, 25 Drawing Sheets

(51) Int. Cl.
*B23K 26/53* (2014.01)
*H01L 21/02* (2006.01)
*H01L 21/268* (2006.01)
*H01L 21/304* (2006.01)
*H01L 21/683* (2006.01)
*H01L 23/544* (2006.01)
*B23K 103/00* (2006.01)

(52) U.S. Cl.
CPC .......... *H01L 21/268* (2013.01); *H01L 21/304* (2013.01); *H01L 21/6836* (2013.01); *H01L 23/544* (2013.01); *B23K 2103/56* (2018.08); *H01L 2221/68336* (2013.01); *H01L 2221/68386* (2013.01); *H01L 2223/5446* (2013.01)

(56) References Cited

FOREIGN PATENT DOCUMENTS

| | | |
|---|---|---|
| JP | 2014-78556 A | 5/2014 |
| JP | 2016-54205 A | 4/2016 |
| WO | WO-03/077295 A1 | 9/2003 |
| WO | WO-2014/030519 A1 | 2/2014 |

Fig.7
(a)
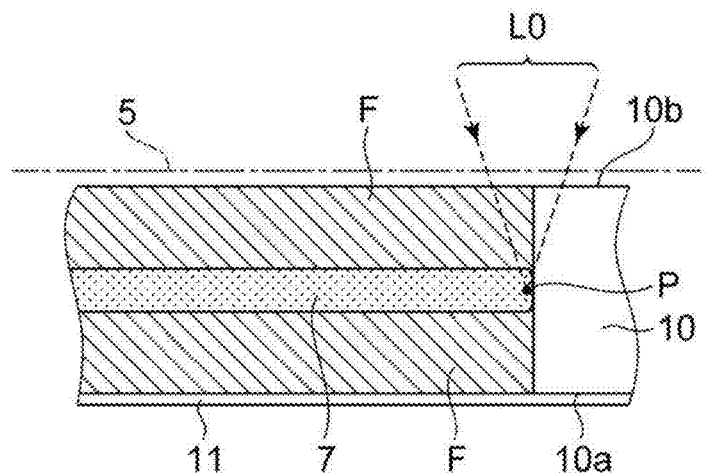
(b)
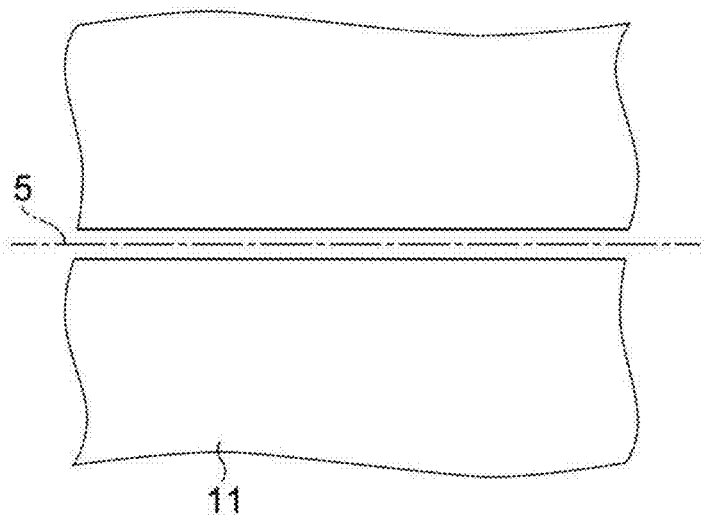

Fig.8
(a)
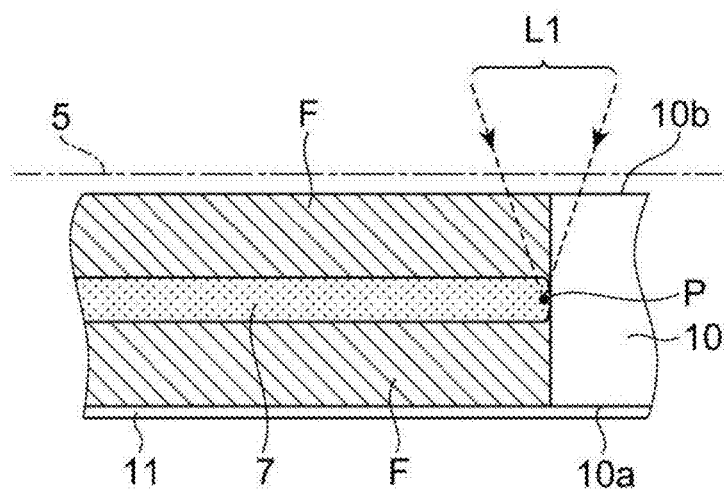
(b)
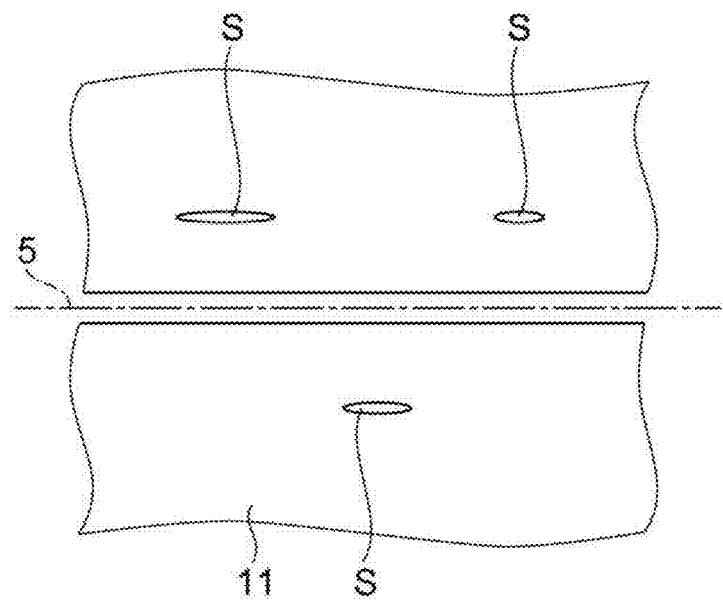

Fig.9
(a)
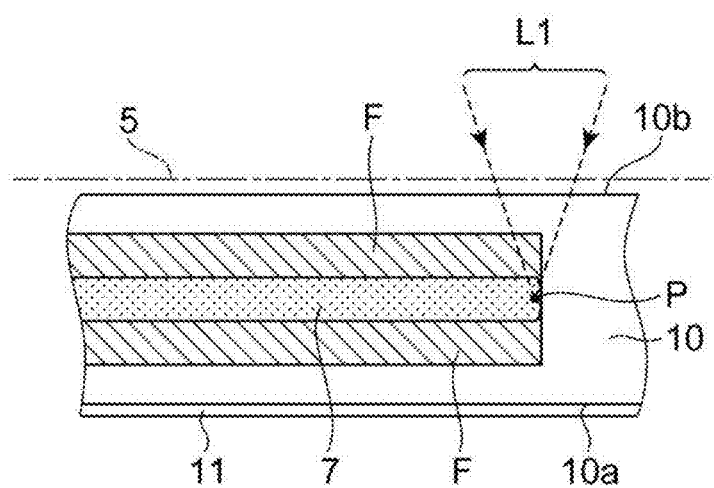
(b)
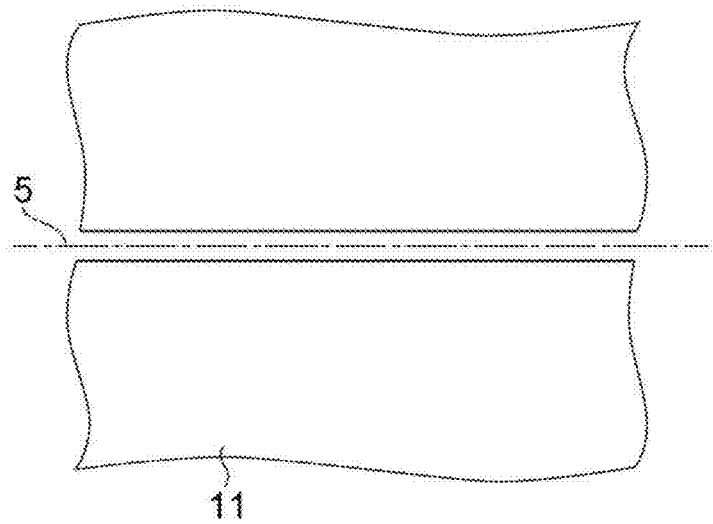

LASER PROCESSING METHOD

TECHNICAL FIELD

One aspect of the present invention relates to a laser processing method.

BACKGROUND ART

A laser processing method has been known that emits laser light to an object to be processed including a silicon substrate formed with a plurality of functional devices on a front surface in a matrix, with a back surface of a silicon substrate as a laser light entrance surface, to form a modified region near the front surface of the silicon substrate along a line to cut set in a grid pattern to pass between adjacent functional devices, and then polishes the back surface of the silicon substrate such that the silicon substrate has a predetermined thickness, to cut the object to be processed for each functional device (for example, see Patent Literature 1).

CITATION LIST

Patent Literature

Patent Literature 1: International Publication No. 03/077295

SUMMARY OF INVENTION

Technical Problem

In the laser processing method as described above, it is important to reduce the number of times of scanning of the laser light for one line to cut (that is, the number of formed rows of the modified region for one line to cut) from a viewpoint of improving processing efficiency. Accordingly, along with formation of the modified region, a crack may be greatly extended from the modified region in the thickness direction of the semiconductor substrate. However, in this case, when the laser light is converged at the semiconductor substrate, damage may occur on the front surface of the semiconductor substrate on the opposite side to the laser light entrance surface, and the characteristics of the functional device may be degraded.

In addition, in the laser processing method as described above, it is desired to increase the yield of a plurality of chips obtained by cutting the object to be processed. For that reason, for example, it is required to suppress appearance of a level difference on a cut surface and to improve straightness of the cut surface.

One aspect of the present invention aims to provide a laser processing method capable of suppressing occurrence of damage on a front surface of an object to be processed on the opposite side to the laser light entrance surface and smoothing the cut surface.

Solution to Problem

A laser processing method according to one aspect of the present invention includes: a first step of converging laser light at an object to be processed including a semiconductor substrate formed with a plurality of functional devices on a front surface, with a back surface of the semiconductor substrate as a laser light entrance surface, and while maintaining a distance between the front surface of the semiconductor substrate and a first converging point of the laser light at a first distance, moving the first converging point of the laser light along a line to cut set to pass between the adjacent functional devices, to form a first modified region along the line to cut; a second step, after the first step, of converging the laser light at the object to be processed, with the back surface of the semiconductor substrate as the laser light entrance surface, and while maintaining a distance between the front surface of the semiconductor substrate and a second converging point at a second distance greater than the first distance, and while offsetting the second converging point of the laser light in a direction vertical to both directions of a thickness direction of the semiconductor substrate and an extending direction of the line to cut with respect to a position at which the first converging point of the laser light is converged, moving the second converging point of the laser light along the line to cut, to form a second modified region along the line to cut; and a third step, after the second step, of removing a predetermined portion including the back surface and at least the second modified region in the semiconductor substrate.

In this laser processing method, when the second modified region is formed in the second step, the second converging point of the laser light is offset in the direction vertical to both directions of the thickness direction of the semiconductor substrate and the extending direction of the line to cut (hereinafter, simply referred to as "the vertical direction of the line to cut") with respect to the position at which the first converging point of the laser light is converged. As a result, the occurrence can be suppressed of the damage on the front surface of the object to be processed on the opposite side to the laser light entrance surface. Due to the offset, a position of the second modified region has a level difference (deviates) from a position of the first modified region in the vertical direction of the line to cut; however, at least the second modified region is removed along with removal of the predetermined portion in the third step. Accordingly, in the object to be processed cut along the line to cut after the removal of the predetermined portion, it is possible to suppress the appearance of the level difference on the cut surface due to the second modified region, and smooth the cut surface to improve the straightness.

In the laser processing method according to one aspect of the present invention, in the third step, a predetermined portion further including the first modified region may be removed in the semiconductor substrate. With this configuration, not only the second modified region but also the first modified region is removed by the third step. Accordingly, in the object to be processed cut along the line to cut after the removal of the predetermined portion, it is also possible to suppress degradation of the straightness of the cut surface due to the first modified region.

In the laser processing method according to one aspect of the present invention, the semiconductor substrate may be a silicon substrate, and the laser light may have a wavelength greater than 1064 nm. As a result, as compared with a case of using laser light having a wavelength of 1064 nm or less, the crack can be greatly extended in the thickness direction of the silicon substrate from the first modified region and the second modified region along with formation of the first modified region and the second modified region.

In the laser processing method according to one aspect of the present invention, the laser light may have a wavelength of 1099 μm or more and 1342 μm or less. In this case, the crack can be more greatly extended in the thickness direction of the silicon substrate from the first modified region and the second modified region along with the formation of the first modified region and the second modified region.

In the laser processing method according to one aspect of the present invention, a distance by which the second converging point of the laser light is offset in the direction vertical to both directions of the thickness direction of the silicon substrate and the extending direction of the line to cut with respect to the position at which the first converging point of the laser light is converged, may be 24 μm or less. In this case, the crack can be reliably connected between the first modified region and the second modified region, and the crack can be reliably extended in the thickness direction of the silicon substrate from the first modified region and the second modified region along with the formation of the first modified region and the second modified region.

In the laser processing method according to one aspect of the present invention, the distance by which the second converging point of the laser light is offset in the direction vertical to both directions of the thickness direction of the silicon substrate and the extending direction of the line to cut with respect to the position at which the first converging point of the laser light is converged, may be 4 μm or more and 18 μm or less. In this case, the crack can be more reliably connected between the first modified region and the second modified region, and the crack can be more reliably extended in the thickness direction of the silicon substrate from the first modified region and the second modified region along with the formation of the first modified region and the second modified region.

In the laser processing method according to one aspect of the present invention, in the second step, by forming the second modified region, a crack extending in the thickness direction of the semiconductor substrate from the first modified region and the second modified region may be caused to reach the front surface of the semiconductor substrate, and in the third step, by removing the predetermined portion, the crack extending in the thickness direction of the semiconductor substrate from the first modified region and the second modified region in the second step may be caused to reach the back surface of the semiconductor substrate from which the predetermined portion has been removed. In this case, the object to be processed can be accurately cut along the line to cut.

Advantageous Effects of Invention

With one aspect of the present invention, it is possible to provide an object to be processed cutting method and an object to be processed cutting device capable of smoothing the cut surface.

BRIEF DESCRIPTION OF DRAWINGS

FIG. 7(a) is a sectional view taken along a line to cut of the object to be processed during laser processing. FIG. 7(b) is a plan view of the object to be processed after cutting.

FIG. 8(a) is a sectional view taken along the line to cut of the object to be processed during laser processing. FIG. 8(b) is a plan view of the object to be processed after cutting.

FIG. 9(a) is a sectional view taken along the line to cut of the object to be processed during laser processing. FIG. 9(b) is a plan view of the object to be processed after cutting.

DESCRIPTION OF EMBODIMENTS

Figure 1:
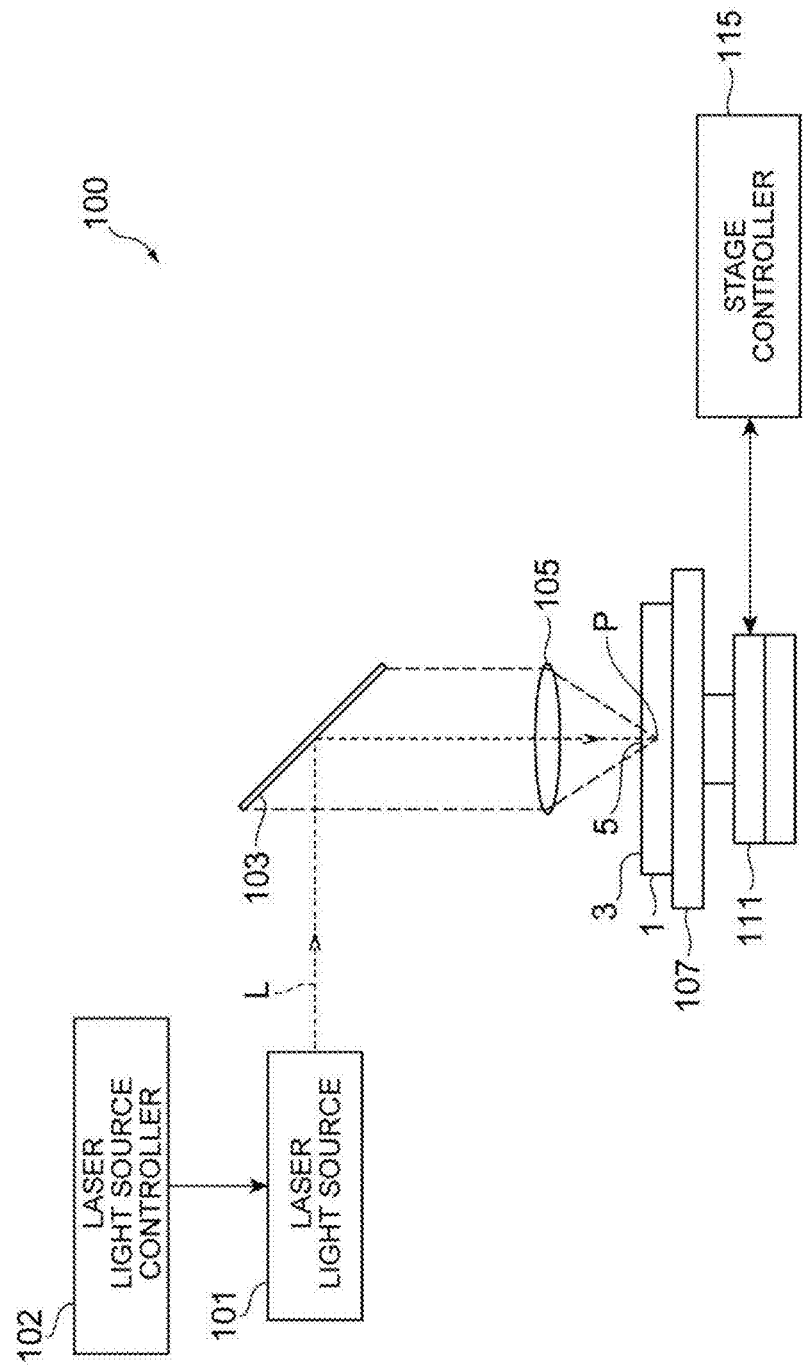
FIG. 1 is a schematic configuration diagram of a laser processing device used for forming a modified region.

In the following, embodiments of the present invention will be described in detail with reference to the drawings. In the drawings, the same or equivalent parts will be denoted by the same reference signs, without redundant description.

A laser processing device and laser processing method according to the embodiments of the present invention converge laser light at an object to be processed to form a modified region within the object to be processed along a line to cut. Therefore, formation of the modified region will be described at first with reference to FIGS. 1 to 6.

As illustrated in FIG. 1, a laser processing device 100 includes a laser light source 101 for causing laser light L to oscillate in a pulsating manner, a dichroic mirror 103 arranged to change a direction of the optical axis (optical path) of the laser light L by 90°, and a converging lens 105 for converging the laser light L. The laser processing device 100 further includes a support table 107 for supporting an object to be processed 1 that is irradiated with the laser light L converged by the converging lens 105, a stage 111 for moving the support table 107, a laser light source controller 102 for regulating the laser light source 101 in order to adjust the output, pulse width, pulse waveform, and the like of the laser light L, and a stage controller 115 for regulating the movement of the stage 111.

In the laser processing device 100, the laser light L emitted from the laser light source 101 changes the direction of its optical axis by 90° with the dichroic mirror 103 and then is converged by the converging lens 105 within the object to be processed 1 mounted on the support table 107. At the same time, the stage 111 is shifted, so that the object to be processed 1 moves with respect to the laser light L along a line to cut 5. As a result, a modified region along the line to cut 5 is formed in the object to be processed 1. While the stage 111 is moved here for relatively moving the laser light L, the converging lens 105 may be moved instead or together therewith.

Figure 2:
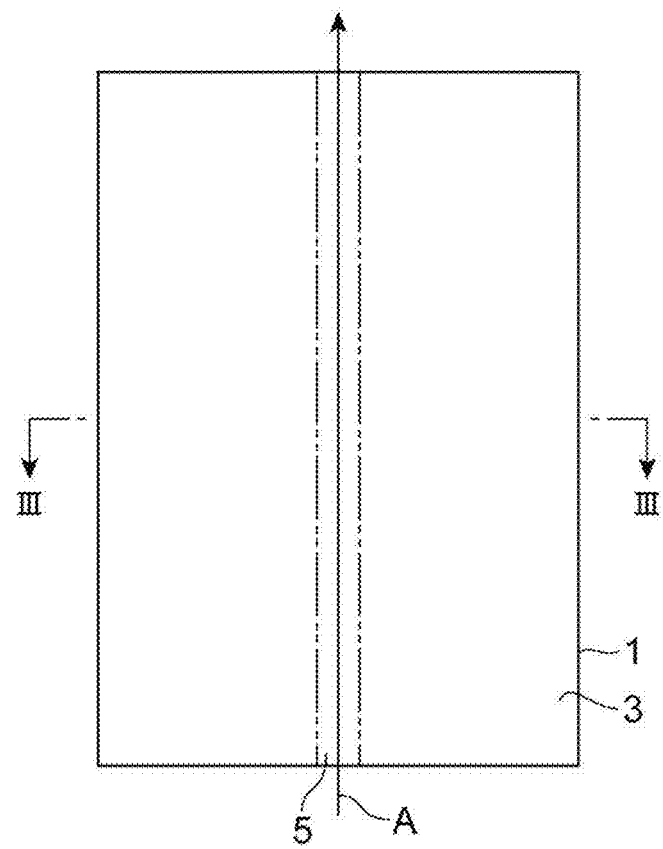
FIG. 2 is a plan view of an object to be processed for which the modified region is formed.
Figure 3:
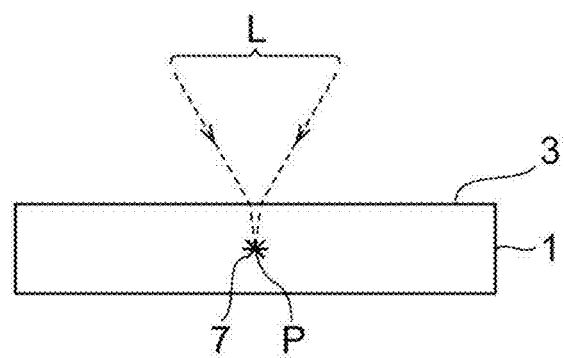
FIG. 3 is a sectional view of the object to be processed taken along the line of FIG. 2.
Figure 4:
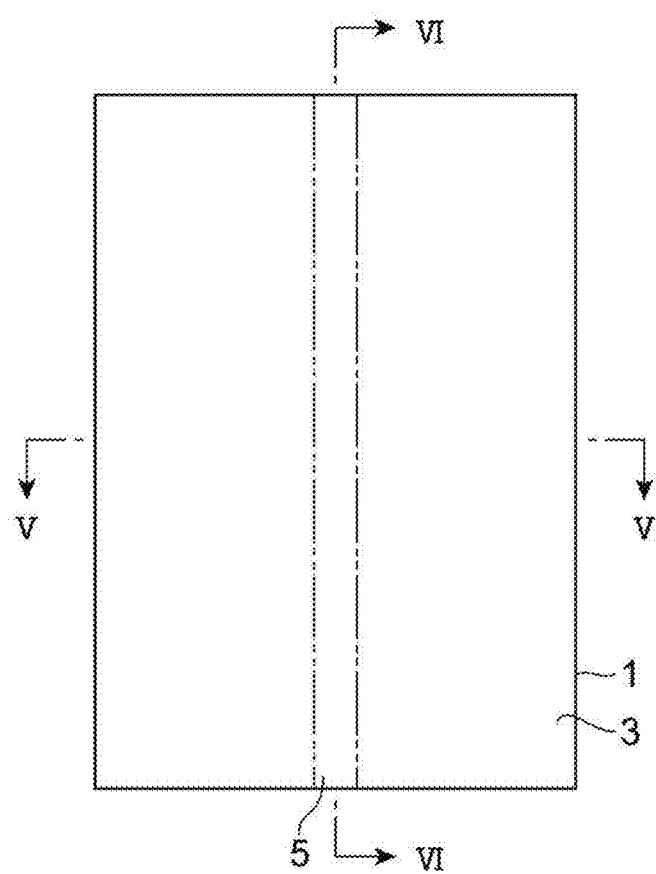
FIG. 4 is a plan view of the object to be processed after laser processing.
Figure 5:
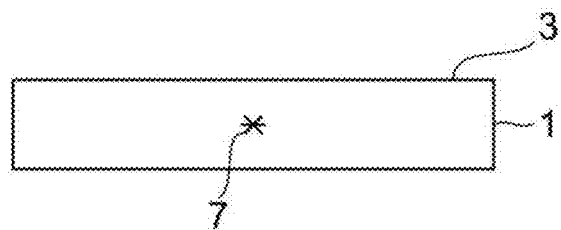
FIG. 5 is a sectional view of the object to be processed taken along the line V-V of FIG. 4.
Figure 6:
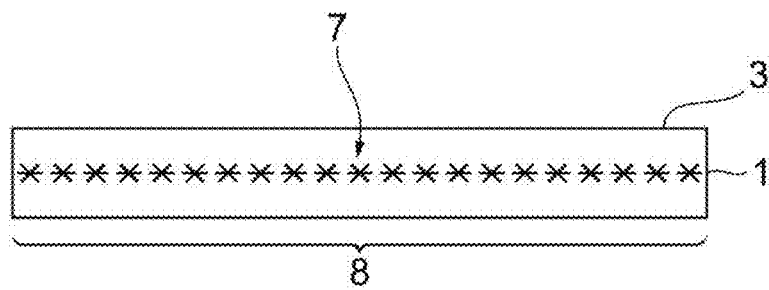
FIG. 6 is a sectional view of the object to be processed taken along the line VI-VI of FIG. 4.

Employed as the object to be processed 1 is a planar member (for example, a substrate or a wafer), examples of which include semiconductor substrates formed of semiconductor materials and piezoelectric substrates formed of piezoelectric materials. As illustrated in FIG. 2, in the object to be processed 1, the line to cut 5 is set for cutting the object to be processed 1. The line to cut 5 is a virtual line extending straight. When for ring a modified region within the object to be processed 1, the laser light L is relatively moved along the line to cut 5 (i.e., in the direction of arrow A in FIG. 2) while locating a converging point (converging position) P within the object to be processed 1 as illustrated in FIG. 3. As a result, a modified region 7 is formed within the object to be processed 1 along the line to cut 5 as illustrated in FIGS. 4, 5 and 6, and the modified region 7 formed along the line to cut 5 becomes a cutting start region 8.

A converging point P is a position at which the laser light L is converged. The line to cut 5 may be curved instead of being straight, a three-dimensional one combining them, or one specified by coordinates. The line to cut 5 may be one actually drawn on a front surface 3 of the object to be processed 1 without being restricted to the virtual line. The modified region 7 may be formed either continuously or intermittently. The modified region 7 may be formed in either rows or dots, and is only required to be formed at least within the object to be processed 1. A crack may be formed from the modified region 7 as a start point, and the crack and the modified region 7 may be exposed at an outer surface (the front surface 3, a back surface, or an outer peripheral surface) of the object to be processed 1. A laser light entrance surface in forming the modified region 7 is not limited to the front surface 3 of the object to be processed 1 but may be the back surface of the object to be processed 1.

Incidentally, in a case where the modified region 7 is formed within the object to be processed 1, the laser light L passes through the object to be processed 1 and is absorbed especially near the converging point P located within the object to be processed 1. As a result, the modified region 7 is formed in the object to be processed 1 (that is, internal absorption type laser processing). In this case, the front surface 3 of the object to be processed 1 hardly absorbs the laser light L and thus does not melt. On the other hand, in a case where the modified region 7 is formed on the front surface 3 of the object to be processed 1, the laser light L is particularly absorbed near the converging point P located on the front surface 3, and removal portions such as holes and grooves are formed (surface absorption type laser processing) by being melted from the front surface 3 and removed.

The modified region 7 is a region in which density, refractive index, mechanical strength and other physical characteristics are different from the surroundings. Examples of the modified region 7 include a molten processed region (meaning at least one of a region resolidified after having being once molten, a region in the molten state, and a region in the process of resolidifying from the molten state), a crack region, a dielectric breakdown region, a refractive index changed region, and a mixed region thereof. Other examples of the modified region 7 include a region where the density of the modified region 7 has changed compared to the density of an unmodified region in a material of the object to be processed 1, and a region formed with a lattice defect. In a case where the material of the object to be processed 1 is single crystal silicon, the modified region 7 can also be said to be a high dislocation density region.

The molten processed region, refractive index changed region, region where the density of the modified region 7 has changed compared to the density of the unmodified region, and region formed with the lattice defect may further incorporate the crack (cracking or microcrack) therewithin or at an interface between the modified region 7 and the unmodified region. The incorporated crack may be formed over the whole surface of the modified region 7 or in only a part or a plurality of parts thereof. The object to be processed 1 includes a substrate made of a crystalline material having a crystal structure. For example, the object to be processed 1 includes a substrate formed of at least one of gallium nitride (GaN), silicon (Si), silicon carbide (SiC), $LiTaO_3$, and sapphire ($Al_2O_3$). In other words, the object to be processed 1 includes, for example, a gallium nitride substrate, a silicon substrate, a SiC substrate, a $LiTaO_3$ substrate, or a sapphire substrate. The crystalline material may be either an anisotropic crystal or an isotropic crystal. Further, the object to be processed 1 may include a substrate made of a non-crystalline material having a non-crystalline structure (amorphous structure), and may include a glass substrate, for example.

In the embodiment, the modified region 7 can be formed by forming a plurality of modified spots (processing marks) along the line to cut 5. In this case, the plurality of modified spots gathers to be the modified region 7. Each of the modified spots is a modified portion formed by a shot of one pulse of pulsed laser light (that is, laser irradiation of one pulse: laser shot). Examples of the modified spots include crack spots, molten processed spots, refractive index changed spots, and those in which at least one of them is mixed. As for the modified spots, their sizes and lengths of the crack occurring therefrom can be controlled as necessary in view of the required cutting accuracy, the demanded flatness of cut surfaces, the thickness, kind, and crystal orientation of the object to be processed 1, and the like. In addition, in the present embodiment, the modified spot can be formed as the modified region 7, along the line to cut 5.

Next, verification results on a splash will be described. Note that, "Damage occurring on the front surface of the object to be processed on the opposite side to the laser light entrance surface in a case where the laser processing as described above is performed on the object to be processed including the semiconductor substrate" is referred to as the "splash". In the following, the silicon substrate is exemplified as the semiconductor substrate.

As illustrated in FIGS. 7 to 10, as the object to be processed, a silicon substrate 10 is prepared having a metal film 11 on a front surface 10a. The metal film 11 is configured by forming a Cr film having a thickness of 20 μm as a base on the front surface 10a of the silicon substrate 10 and forming an Au film having a thickness of 50 μm on the Cr film.

As illustrated in FIG. 7(a), with a back surface 10b of the silicon substrate 10 as the laser light entrance surface, laser light L0 having a wavelength of 1064 nm is converged within the silicon substrate 10, and a converging point P of the laser light L0 is moved along the line to cut 5, whereby the modified region 7 is formed within the silicon substrate 10 along the line to cut 5. At this time, irradiation conditions of the laser light L0 are adjusted such that a crack F extending in the thickness direction of the silicon substrate 10 from the modified region 7 along with formation of the modified region 7 (that is, the crack F occurring along with the formation of the modified region 7 without applying external force to the silicon substrate 10) reaches the front surface 10a of the silicon substrate 10. In this case, the splash does not occur on the metal film 11, as illustrated in FIG. 7(b).

As illustrated in FIG. 8(a), with the back surface 10b of the silicon substrate 10 as the laser light entrance surface, laser light L1 having a wavelength of 1342 nm is converged within the silicon substrate 10, and the converging point P of the laser light L1 is moved along the line to cut 5, whereby the modified region 7 is formed within the silicon substrate 10 along the line to cut 5. At this time, irradiation conditions of the laser light L1 are adjusted such that the crack F extending from the modified region 7 reaches the front surface 10a of the silicon substrate 10. Specifically, except that the wavelength is different, the irradiation conditions of the laser light L1 are the same as the above-described irradiation conditions of the laser light L0. In this case, a splash S is generated on the metal film 11, as illustrated in FIG. 8(b).

As illustrated in FIG. 9(a), with the back surface 10b of the silicon substrate 10 as the laser light entrance surface, the laser light L1 having a wavelength of 1342 nm is converged within the silicon substrate 10, and the converging point P of the laser light L1 is moved along the line to cut 5, whereby the modified region 7 is formed within the silicon substrate 10 along the line to cut 5. At this time, the irradiation conditions of the laser light L1 are adjusted such that the crack F extending from the modified region 7 falls within the silicon substrate 10 without reaching the front surface 10a of the silicon substrate 10. Specifically, pulse energy of the laser light L1 is made smaller than in the case of FIG. 8. In this case, the splash does not occur on the metal film 11, as illustrated in FIG. 9(b).

As illustrated in FIG. 10(a), with the back surface 10b of the silicon substrate 10 as the laser light entrance surface, the laser light L1 having a wavelength of 1342 nm is converged within the silicon substrate 10, and the converging point P of the laser light L1 is moved along the line to cut 5, whereby a first modified region 7a and a second modified region 7b are formed within the silicon substrate 10 along the line to cut 5. At this time, the irradiation conditions of the laser light L1 are adjusted such that the crack F does not reach the front surface 10a of the silicon substrate 10 when only the first modified region 7a is formed, and the crack F reaches the front surface 10a of the silicon substrate 10 when the second modified region 7b is formed on the back surface 10b side of the silicon substrate 10 with respect to the first modified region 7a. In this case, the splash S occurs on the metal film 11, as illustrated in FIG. 10(b).

Figure 10:
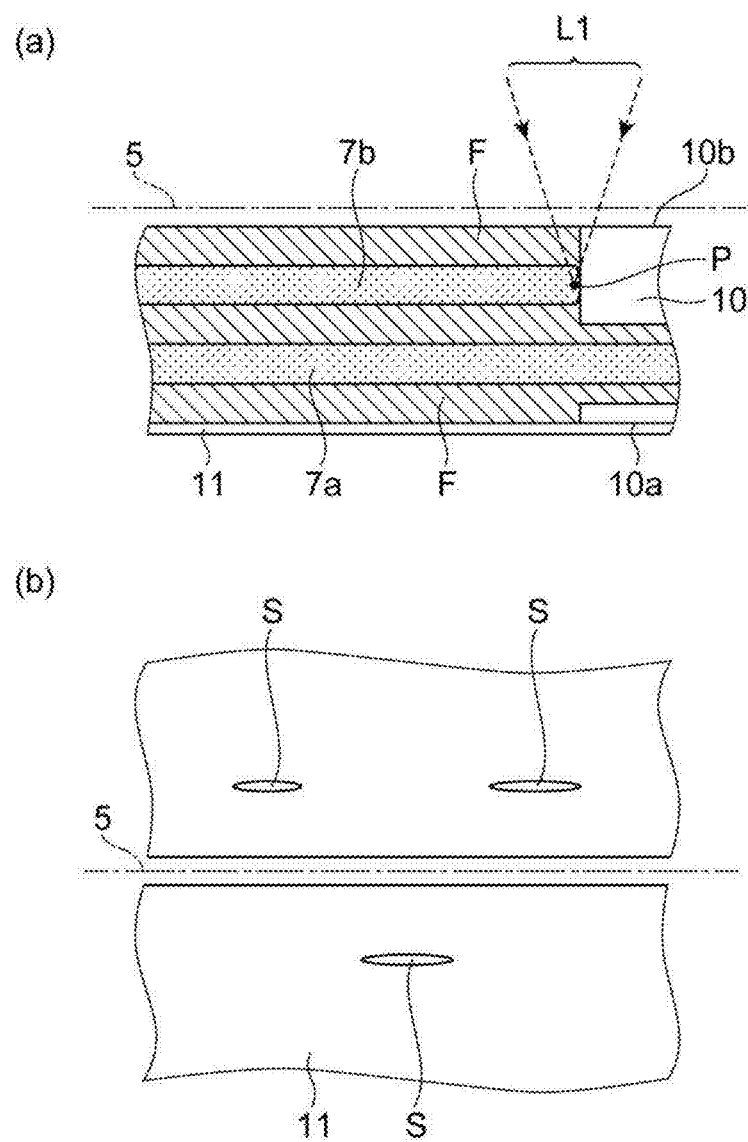
FIG. 10(a) is a sectional view taken along the line to cut of the object to be processed during laser processing.
FIG. 10(b) is a plan view of the object to be processed after cutting.
Figure 11:
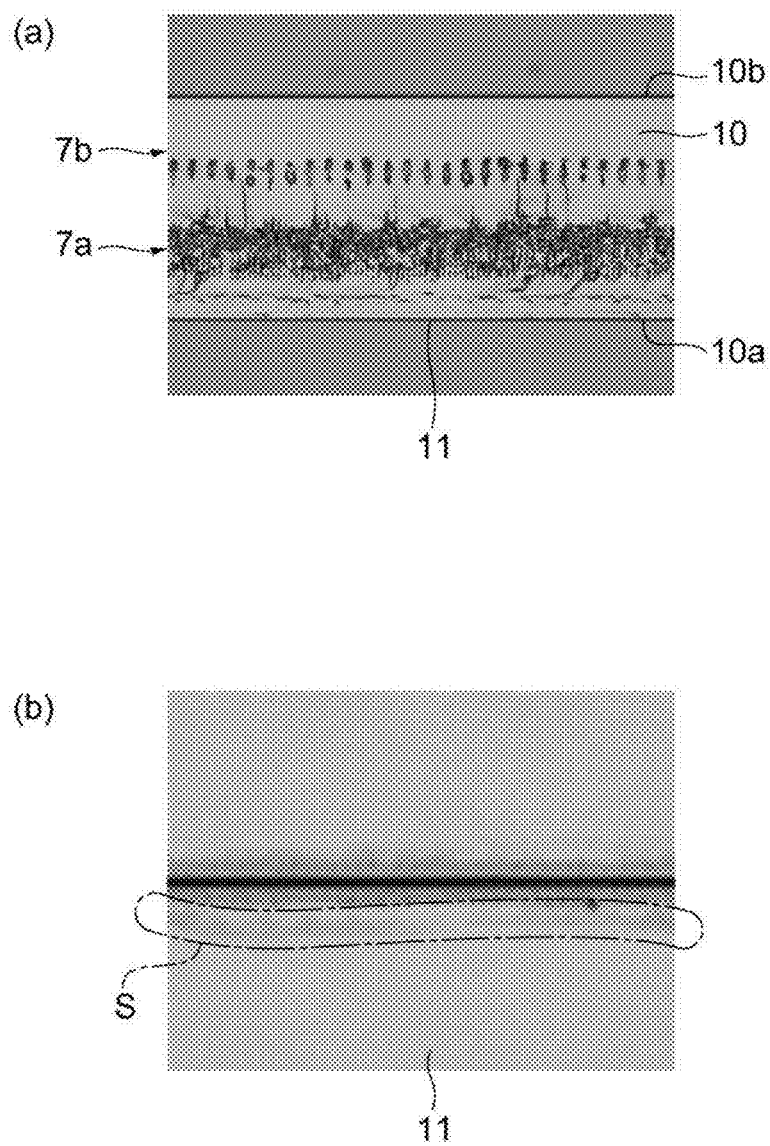
FIG. 11(a) is a view illustrating a photograph of a surface parallel to the line to cut of the silicon substrate after cutting.
FIG. 11(b) is a view illustrating a photograph of the front surface side of the silicon substrate after cutting.

FIG. 11 is a view illustrating a photograph of the silicon substrate 10 when the first modified region 7a and the second modified region 7b are formed within the silicon substrate 10 under the condition of the case of FIG. 10. Specifically, FIG. 11(a) is a view illustrating a photograph of a surface parallel to the line to cut of the silicon substrate 10 after cutting. FIG. 11(b) is a view illustrating a photograph of the front surface 10a side (metal film 11) of the silicon substrate 10 after cutting. Referring to FIG. 11(b), it can be confirmed that a dark portion exists in a region surrounded by the one-dot chain line in the metal film 11. This is the problem splash S.

When the laser light L1 having a wavelength greater than 1064 nm such as 1342 nm is used, as compared with a case where the laser light L0 having a wavelength of 1064 nm or less is used, the crack F can be greatly extended in the thickness direction of the silicon substrate 10 from the modified region 7. When the laser light L1 having a wavelength greater than 1064 nm such as 1342 nm is used, as compared with the case where the laser light L0 having a wavelength of 1064 nm or less is used, the modified region 7 can be formed at a deep position from the laser light entrance surface of the silicon substrate 10. These results from the fact that the laser light L1 having a wavelength greater than 1064 nm has a higher transmittance to silicon than the laser light L0 having a wavelength of 1064 nm or less. Therefore, from a viewpoint of reducing the number of times of scanning of the laser light L for one line to cut 5 (that is, the number of formed rows of the modified region 7 for one line to cut 5) to improve the processing efficiency, it is preferable to use the laser light L1 having a wavelength greater than 1064 nm.

However, when attempting to cause the crack F to reach the front surface 10a of the silicon substrate 10 by using the laser light L1 having a wavelength greater than 1064 nm, the splash S occurs on the metal film 11, as in the case of the above-described FIGS. 8 and 10. When the splash S occurs in a case where a functional device (for example, a semiconductor operating layer formed by crystal growth, a light receiving device such as a photodiode, a light emitting device such as a laser diode, or a circuit device formed as a circuit) is formed on the front surface 10a of the silicon substrate 10 on the opposite side to the laser light entrance surface, the characteristics of the functional device may be degraded.

Therefore, in a case where the crack F is caused to reach the front surface 10a of the silicon substrate 10 by using the laser light L1 having a wavelength greater than 1064 nm, if occurrence can be suppressed of the splash S, it is technically significant.

The present inventors has considered that the occurrence of the splash S on the front surface 10a of the silicon substrate 10 is due to the fact that, when the laser light L1 having a wavelength greater than 1064 nm is used, the laser light L1 is converged at the crack F greatly extended from the modified region 7 already formed, and influence increases of escaping light (light that does not contributes to the formation of the modified region 7 and escape to the front surface 10a side of the silicon substrate 10, in the laser light L1). From that knowledge, the present inventors have considered that, when the second modified region 7b is formed in the case of FIG. 10, if the converging point P of the laser light L1 is offset, the influence can be reduced of the escaping light that causes the occurrence of the splash S, and have performed the following verification. Note that, when the second modified region 7b is formed, the fact that "the converging point P of the laser light L1 is offset in a direction vertical to both directions of the thickness direction of the silicon substrate 10 and an extending direction of the line to cut 5 (direction vertical to the cross section of the silicon substrate 10 in FIG. 10(a)), with respect to a position at which the converging point P of the laser light L1 is converged when the first modified region 7a is formed" is simply referred to as "the converging point P of the laser light L1 is offset". A "distance by which the converging point P of the laser light L1 is offset" is referred to as an "offset amount".

Figure 12:
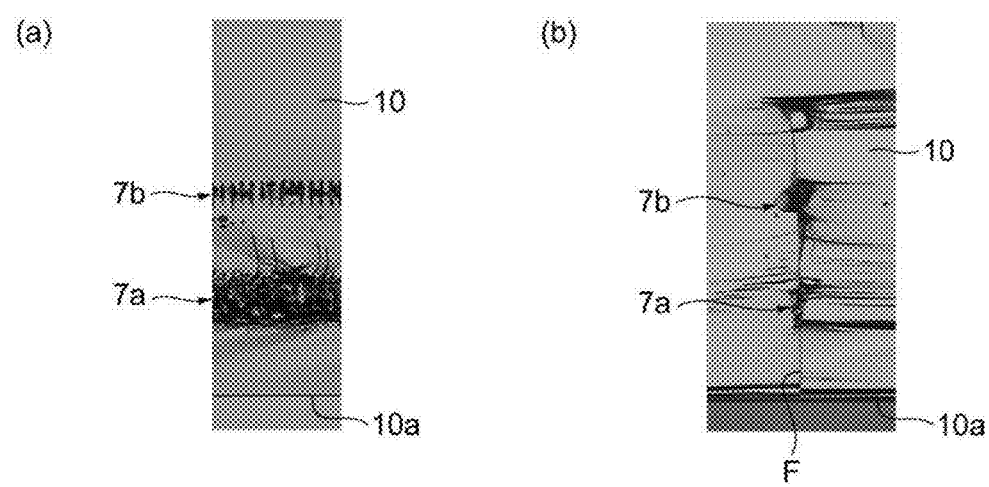
FIG. 12(a) is a view illustrating a photograph of a surface parallel to the line to cut of the silicon substrate after formation of a first modified region and a second modified region.
FIG. 12(b) is a view illustrating a photograph of a surface vertical to the line to cut of the silicon substrate after the formation of the first modified region and the second modified region.

First, verification is performed for the direction of the crack F extending from the first modified region 7a to the front surface 10a side of the silicon substrate 10. FIG. 12 is a view illustrating a photograph of the silicon substrate 10 in a case where the converging point P of the laser light L1 is not offset when the second modified region 7b is formed. Specifically, FIG. 12(a) is a view illustrating a photograph of a surface parallel to the line to cut of the silicon substrate 10 after formation of the first modified region 7a and the second modified region 7b. FIG. 12(b) is a view illustrating a photograph of a surface vertical to the line to cut of the silicon substrate 10 after the formation of the first modified region 7a and the second modified region 7b. Referring to FIG. 12(b), it can be confirmed that in a case where the converging point P of the laser light L1 is not offset when the second modified region 7b is formed, the crack F extends straight (along the thickness direction of the silicon substrate 10) to the front surface 10a side of the silicon substrate 10 from the first modified region 7a.

Figure 13:
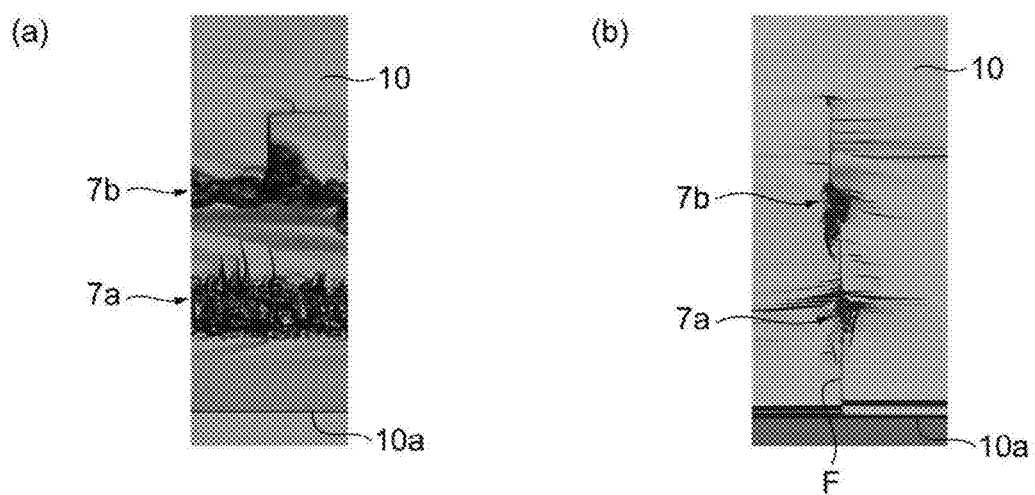
FIG. 13(a) is a view illustrating a photograph of a surface parallel to the line to cut of the silicon substrate after the formation of the first modified region and the second modified region.
FIG. 13(b) is a view illustrating a photograph of a surface vertical to the line to cut of the silicon substrate after the formation of the first modified region and the second modified region.

FIG. 13 is a view illustrating a photograph of the silicon substrate 10 in a case where the converging point P of the laser light L1 is offset (in a case where the offset amount is 8 μm) when the second modified region 7b is formed. Specifically, FIG. 13(a) is a view illustrating a photograph of a surface parallel to the line to cut of the silicon substrate 10 after the formation of the first modified region 7a and the second modified region 7b. FIG. 13(b) is a view illustrating a photograph of a surface vertical to the line to cut of the silicon substrate 10 after the formation of the first modified region 7a and the second modified region 7b. Referring to FIG. 13(b), it can be confirmed that also in a case where the converging point P of the laser light L1 is offset when the second modified region 7b is formed, the crack F extends straight (along the thickness direction of the silicon substrate 10) to the front surface 10a side of the silicon substrate 10 from the first modified region 7a.

Figure 14:
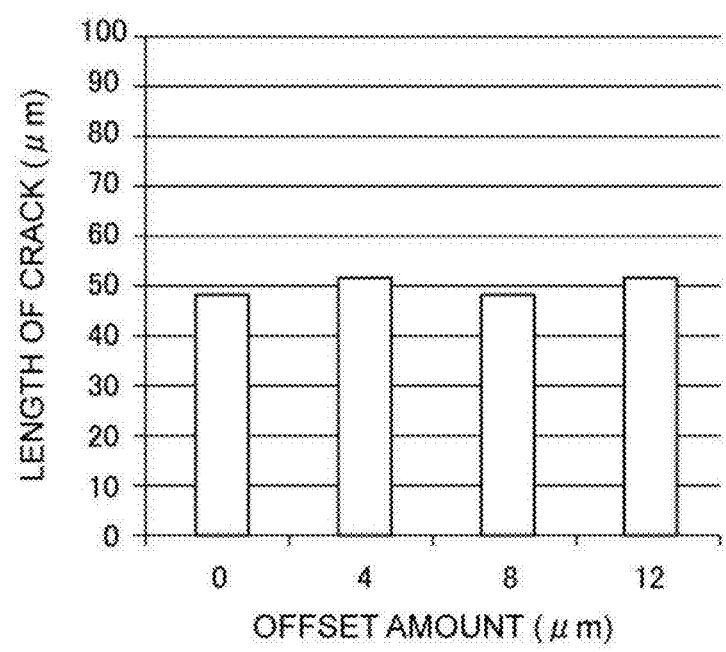
FIG. 14 is a graph illustrating a relationship between an offset amount and a length of a crack.

Subsequently, verification is performed for the length of the crack F extending from the first modified region 7a to the front surface 10a side of the silicon substrate 10. FIG. 14 is a graph illustrating a relationship between the offset amount and the length of the crack F. The length of the crack F is the length of the crack F extending from the first modified region 7a to the front surface 10a side of the silicon substrate 10. Referring to FIG. 14, it can be confirmed that even if the converging point P of the laser light L1 is offset or not offset (even in a case where the offset amount is 0 μm) when the second modified region 7b is formed, the length does not change of the crack F extending from the first modified region 7a to the front surface 10a side of the silicon substrate 10.

Figure 15:
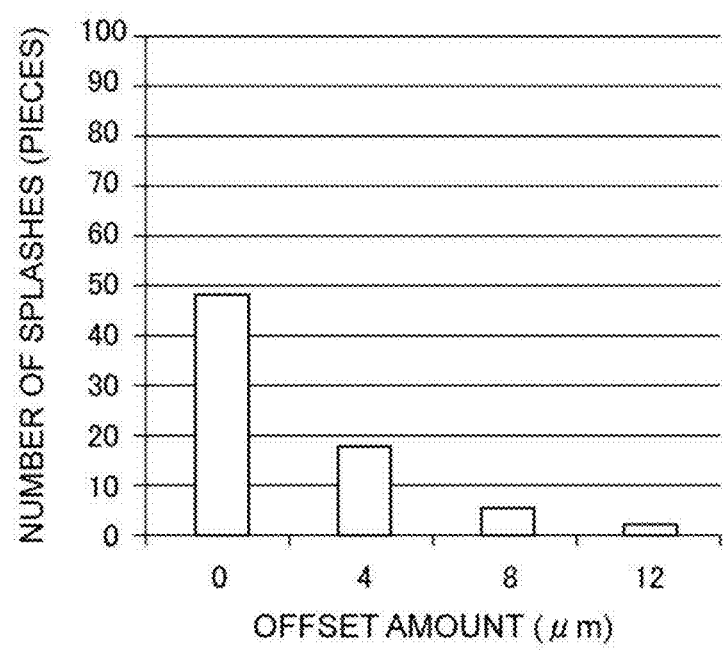
FIG. 15 is a graph illustrating a relationship between the offset amount and the number of splashes.

Subsequently, verification is performed for a generation amount of the splash S. FIG. 15 is a graph illustrating a relationship between the offset amount and the number of the splashes S. The number of the splashes S is the number of the splashes S generated in regions 20 μm or more away to both sides from the line to cut 5 (the number per 15 mm length of the line to cut 5). Referring to FIG. 15, it can be confirmed that when the converging point P of the laser light L1 is offset when the second modified region 7b is formed, the number of the splashes S decreases as compared with a case where the converging point P is not offset (in the case where the offset amount is 0 μm). Note that, the reason why the number of the splashes S generated in the regions 20 μm or more away to both sides from the line to cut 5 is counted, is that such splash S particularly causes a problem in which characteristics are degraded of the functional device formed on the front surface 10a of the silicon substrate 10. Since a dicing street (region between the adjacent functional devices) is often provided in the regions within 20 μm on both sides of the line to cut 5, there is a low possibility that the splash S occurring in the regions causes the problem in which the characteristics of the functional device are degraded.

From the verification results of FIGS. 12 to 15, it is found that even if the converging point P of the laser light L1 is offset when the second modified region 7b is formed, the crack F extends straight (along the thickness direction of the silicon substrate 10) to the front surface 10a side of the silicon substrate 10 from the first modified region 7a, and the length does not change of the crack F extending from the first modified region 7a to the front surface 10a side of the silicon substrate 10. On the other hand, it is found that when the converging point P of the laser light L1 is offset when the second modified region 7b is formed, the number of splashes S decreases. In the verification of FIGS. 12 to 15, the irradiation conditions of the laser light other than the offset amount are the same.

Figure 16:
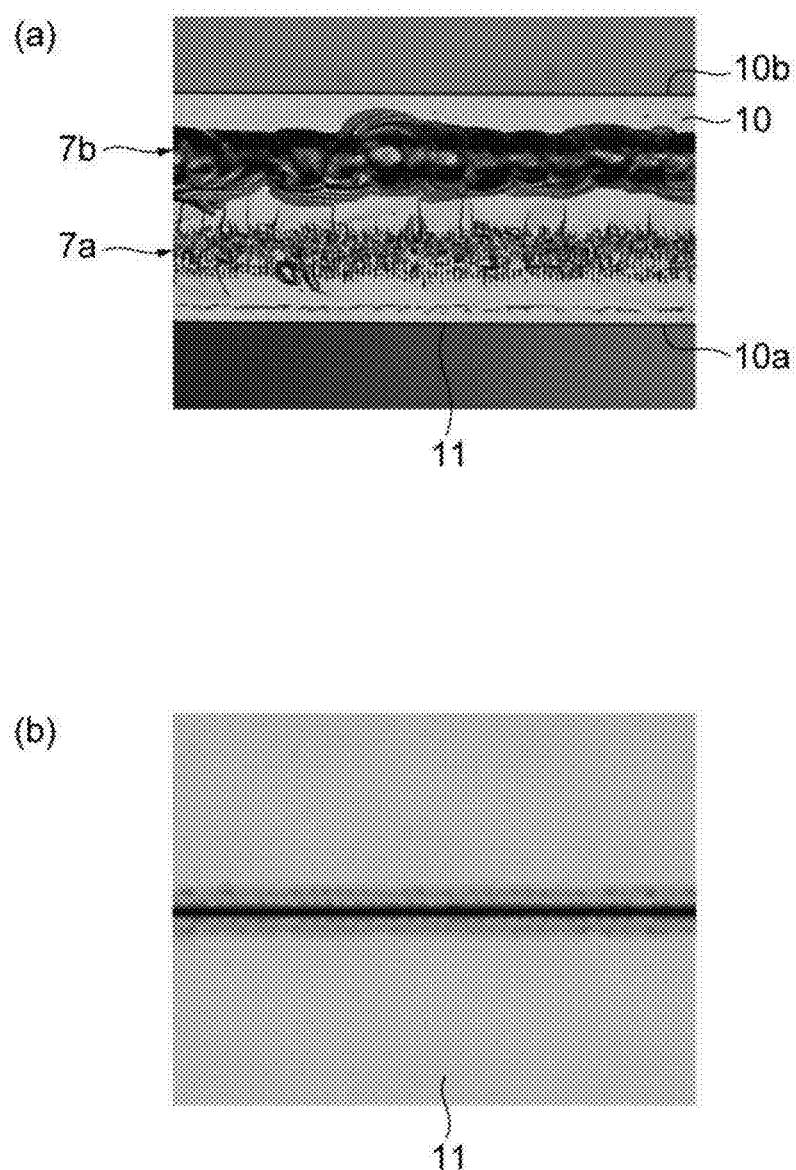
FIG. 16(a) is a view illustrating a photograph of a surface parallel to the line to cut of the silicon substrate after cutting.
FIG. 16(b) is a view illustrating a photograph of the front surface side of the silicon substrate after cutting.

The present inventors' consideration on the decrease in the number of the splashes S is as follows. FIG. 16 is a view illustrating a photograph of the silicon substrate 10 in the case where the converging point P of the laser light L1 is offset when the second modified region 7b is formed. Specifically, FIG. 16(a) is a view illustrating a photograph of a surface parallel to the line to cut 5 of the silicon substrate 10 after cutting. FIG. 16(b) is a view illustrating a photograph of the front surface 10a side (metal film 11) of the silicon substrate 10 after cutting. Referring to FIG. 16(a), it can be confirmed that the converging point P of the laser light L1 is offset when the second modified region 7b is formed, whereby the laser light L1 is suppressed to be converged at the crack F extending from the second modified region 7b and the first modified region 7a already formed, and the second modified region 7b is formed to be large. That is, it is considered that the proportion of the laser light L1 contributing to the formation of the second modified region 7b increases, and the proportion of the escaping light decreases. Referring to FIG. 16(b), it can be confirmed that the splash S does not occur.

On the other hand, referring to FIG. 11(a) illustrating the photograph of the silicon substrate 10 in the case where the converging point P of the laser light L1 is not offset when the second modified region 7b is formed, it can be confirmed that the second modified region 7b is formed to be small. This is considered to be due to the fact that the laser light L1 is converged at the crack F extending from the second modified region 7b and the first modified region 7a already formed, and the escaping light is increased. In the verification of FIGS. 11 and 16, the irradiation conditions of the laser light other than the offset amount are the same.

Figure 17:
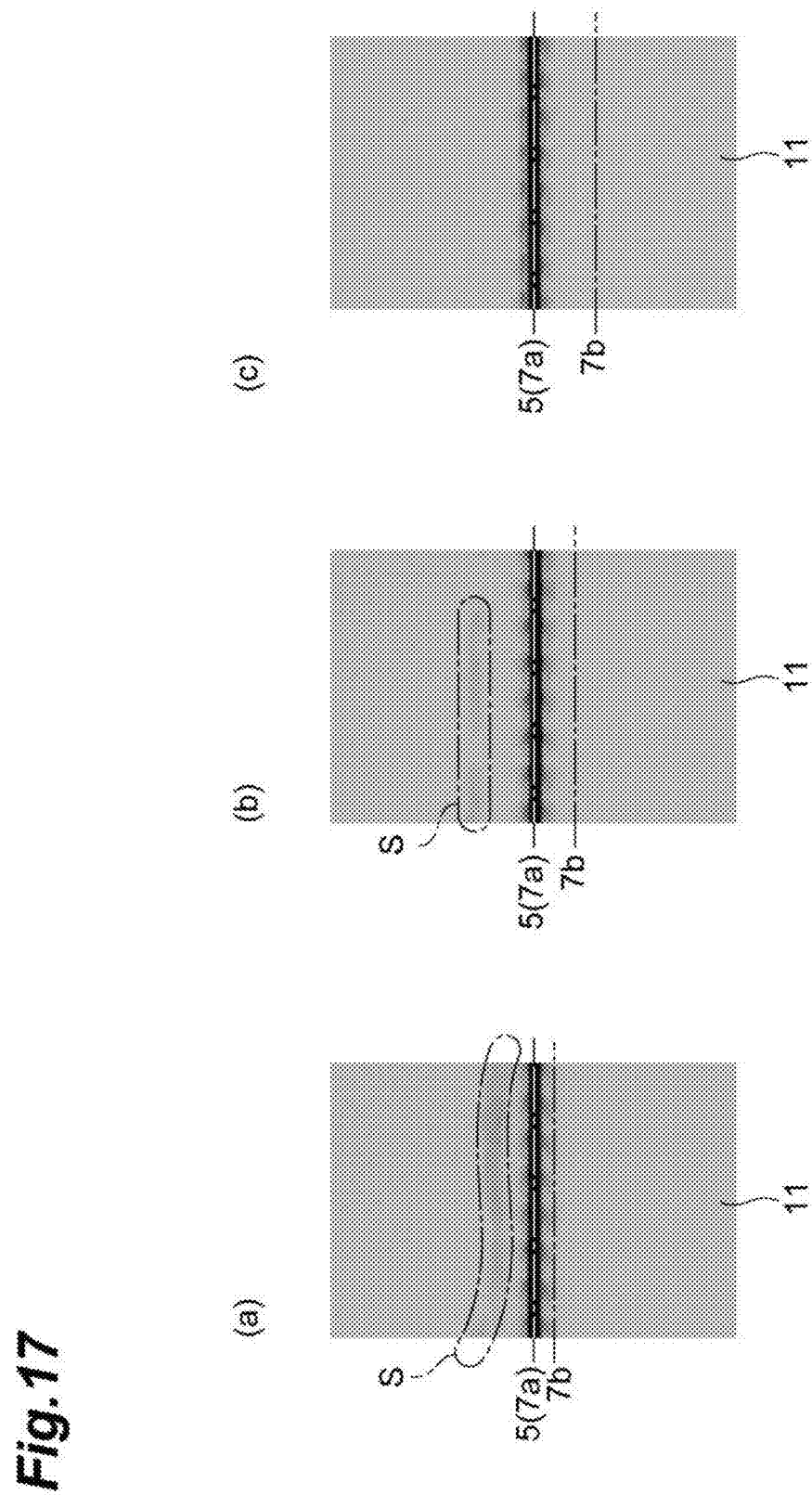
FIG. 17(a) is a view illustrating a photograph of the front surface side of the silicon substrate after cutting in a case where the offset amount is 2 μm.
FIG. 17(b) is a view illustrating a photograph of the front surface side of the silicon substrate after cutting in a case where the offset amount is 4 μm.
FIG. 17(c) is a view illustrating a photograph of the front surface side of the silicon substrate after cutting in a case where the offset amount is 6 μm.

FIG. 17 is a view illustrating a photograph of the front surface 10a side (metal film 11) of the silicon substrate 10 after cutting. Specifically, FIG. 17(a) illustrates a case where the offset amount is 2 µm. FIG. 17(b) illustrates a case where the offset amount is 4 µm. FIG. 17(c) illustrates a case where the offset amount is 6 µm. In each case, the irradiation conditions of the laser light other than the offset amount are the same. Referring to FIGS. 17(a) and 17(b), it can be confirmed that the splash S occurs on the opposite side to a side in which the converging point P of the laser light L1 is offset when the second modified region 7b is formed, and the splash S is away from the line to cut 5 as the offset amount is increased. Referring to FIGS. 17(a), 17(b) and 17(c), it can be confirmed that an occurrence region of the splash S is decreased as the offset amount is increased. Note that, even in the cases of FIGS. 17(a) and 17(b), as compared with the case where the converging point P of the laser light L1 is not offset when the second modified region 7b is formed, the occurrence region of the splash S is decreased.

The reasons why the results of FIGS. 17(a), 17(b) and 17(c) are obtained are considered as follows. FIG. 18(a) is a view illustrating a surface vertical to the line to cut 5 of the silicon substrate 10 in a case where the offset amount is small. FIG. 18(b) is a view illustrating a surface vertical to the line to cut 5 of the silicon substrate 10 in a case where the offset amount is large. Note that, "the converging point P of the laser light L1 when the first modified region 7a is formed" is referred to as "a first converging point P1". "The converging point P of the laser light L1 when the second modified region 7b is formed" is referred to as "a second converging point P2".

As illustrated in FIG. 18(a), in the case where the offset amount is small, in the crack F extending from the second modified region 7b and the first modified region 7a already formed, a portion F1 at which the second converging point P2 of the laser light L1 is converged is inclined at a small angle with respect to a thickness direction D of the silicon substrate 10. For that reason, an incident angle θ of the laser light L1 with respect to the portion F1 becomes large. Therefore, the escaping light L2 not contributing to the formation of the second modified region 7b in the laser light L1 travels to the opposite side to the side in which the converging point P of the laser light L1 is offset, at a small angle with respect to the thickness direction D of the silicon substrate 10. As a result, the optical path length of the escaping light L2 reaching the front surface 10a of the silicon substrate 10 becomes short, and the absorption amount and scattering degree of the escaping light L2 in the silicon substrate 10 become small. Note that "small", "large", "short", and the like are used in comparison with the case of FIG. 18(b).

On the other hand, as illustrated in FIG. 18(b), in the case where the offset amount is large, in the crack F extending from the second modified region 7b and the first modified region 7a already formed, the portion F1 at which the second converging point P2 of the laser light L1 is converged is inclined at a large angle with respect to the thickness direction D of the silicon substrate 10. For that reason, the incident angle θ of the laser light L1 with respect to the portion F1 becomes small. Therefore, the escaping light L2 not contributing to the formation of the second modified region 7b in the laser light L1 travels to the opposite side to the side in which the converging point P of the laser light L1 is offset, at a large angle with respect to the thickness direction D of the silicon substrate 10. As a result, the optical path length of the escaping light L2 reaching the front surface 10a of the silicon substrate 10 becomes long, and the absorption amount and scattering degree of the escaping light L2 in the silicon substrate 10 become large. Note that, "large", "small", "long", and the like are used in comparison with the case of FIG. 18(a).

Figure 18:
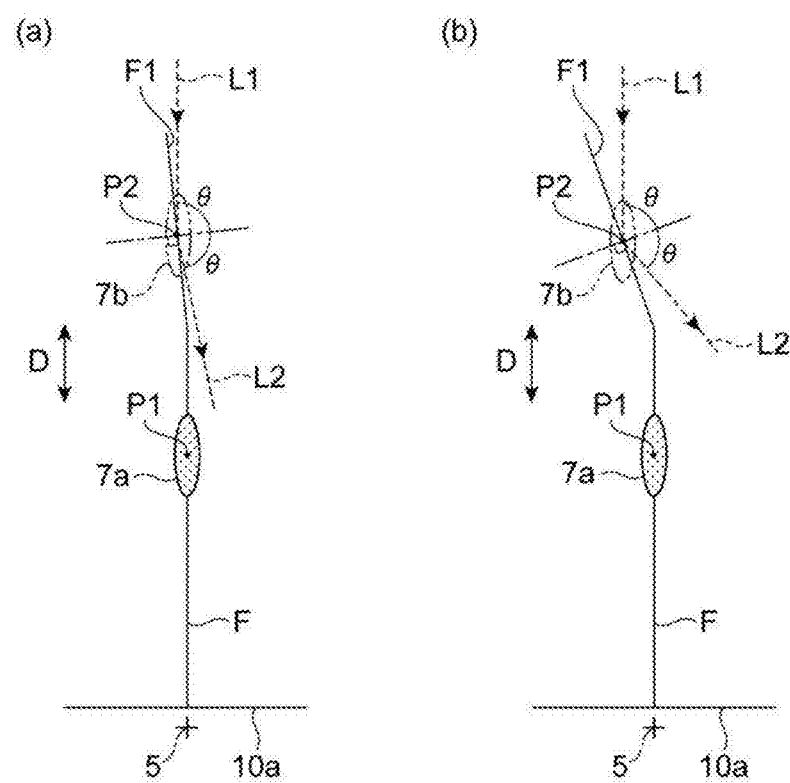
FIG. 18(a) is a view illustrating a surface vertical to the line to cut of the silicon substrate in a case where the offset amount is small.
FIG. 18(b) is a view illustrating a surface vertical to the line to cut of the silicon substrate in a case where the offset amount is large.

From the above consideration of FIG. 18, it is considered that the splash S occurs on the opposite side to the side in which the converging point P of the laser light L1 is offset when the second modified region 7b is formed, and the splash S is away from the line to cut 5 as the offset amount is increased, and the occurrence region of the splash S is decreased as the offset amount is increased.

Figure 19:
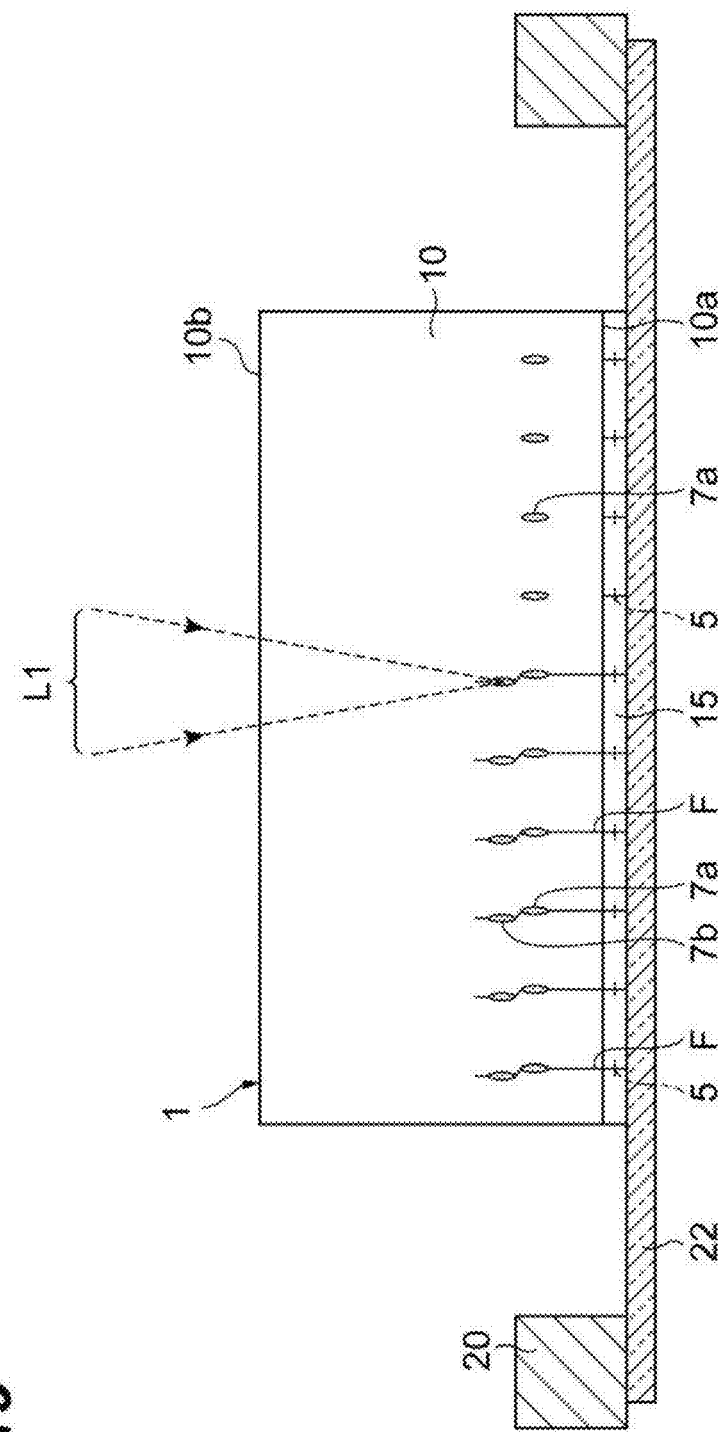
FIG. 19 is a sectional view for explaining a semiconductor chip manufacturing method using a laser processing method of an embodiment.

Next, a semiconductor chip manufacturing method using a laser processing method of the embodiment will be described. First, as illustrated in FIG. 19, the object to be processed 1 including the silicon substrate 10 having a functional device layer 15 on the front surface 10a is prepared. The functional device layer 15 side of the object to be processed 1 is pasted to a protective film 22 held by a ring-shaped holding member 20. The functional device layer 15 includes a plurality of functional devices arranged in a matrix.

Subsequently, the first modified region 7a is formed along each of the lines to cut 5 set in a grid pattern to pass between the adjacent functional devices. Specifically, with the back surface 10b of the silicon substrate 10 as the laser light entrance surface, the laser light L1 having a wavelength greater than 1064 nm is converged at the silicon substrate 10, and while a distance between the front surface 10a of the silicon substrate 10 and the first converging point P1 of the laser light L is maintained at a first distance, the first converging point P1 of the laser light L1 is moved along the line to cut 5, whereby the first modified region 7a is formed along the line to cut 5 (first step). At this time, while the distance is maintained at 0 by which the first converging point P1 of the laser light L1 is offset in the direction vertical to both the thickness direction of the silicon substrate 10 and the extending direction of the line to cut 5, with respect to the line to cut 5, the first converging point P1 of the laser light L1 is moved along the line to cut 5. That is, while a state is maintained in which the first converging point P1 of the laser light L is positioned on the line to cut 5 as viewed from the thickness direction of the silicon substrate 10, the first converging point P1 of the laser light L is moved along the line to cut 5. As a result, the first modified region 7a is formed within the silicon substrate 10 along the line to cut 5 in a state of being positioned on the line to cut 5 as viewed from the thickness direction of the silicon substrate 10.

Subsequently, the second modified region 7b is formed along each of the lines to cut 5 set in a grid pattern to pass between the adjacent functional devices. Specifically, with the back surface 10b of the silicon substrate 10 as the laser light entrance surface, the laser light L1 having a wavelength greater than 1064 nm is converged at the silicon substrate 10, and while a distance between the front surface 10a of the silicon substrate 10 and the second converging point P2 of the laser light L1 is maintained at a second distance greater than the first distance, and while the second converging point P2 of the laser light L1 is offset, the second converging point P2 of the laser light L1 is moved along the line to cut 5, whereby the second modified region 7b is formed along the line to cut 5 (second step). That is, while a state is maintained in which the second converging point P2 of the laser light L is away from the line to cut 5 by a predetermined distance as viewed from the thickness direction of the silicon substrate 10, the second converging point P2 of the laser light L is moved along the line to cut 5 (parallel to the line to cut 5). As a result, the second modified region 7b is formed within the silicon substrate 10 along the line to cut 5 (parallel to the line to cut 5) in a state of being away from the line to cut 5 by the predetermined distance as viewed from the thickness direction of the silicon substrate 10.

As a result, the crack F extending in the thickness direction of the silicon substrate 10 from the first modified region 7a and the second modified region 7b reaches the front surface 10a of the silicon substrate 10, and the functional device layer 15 is cut for each functional device. As an example, the thickness of the silicon substrate 10 is 775 μm, and the first modified region 7a and the second modified region 7b are formed in a region from the front surface 10a of the silicon substrate 10 to a depth of 160 μm.

The above-described first step and second step are performed by the laser processing device 100 described above. That is, the support table 107 supports the object to be processed 1. The laser light source 101 emits the laser light L1 having a wavelength greater than 1064 nm. The converging lens (converging optical system) 105 converges the laser light L1 emitted from the laser light source 101 at the object to be processed 1 supported by the support table 107 such that the back surface 10b of the silicon substrate 10 is the laser light entrance surface. Then, the stage controller (controller) 115 and the laser light source controller (controller) 102 control operation of the support table 107 and the laser light source 101 such that the above-described first step and second step are performed. Note that, the movement of the first converging point P1 and the second converging point P2 of the laser light L with respect to the line to cut 5 may be implemented by operation of the converging lens 105 side, or may be implemented by operation of both of the support table 107 side and the converging lens 105 side.

Figure 20:
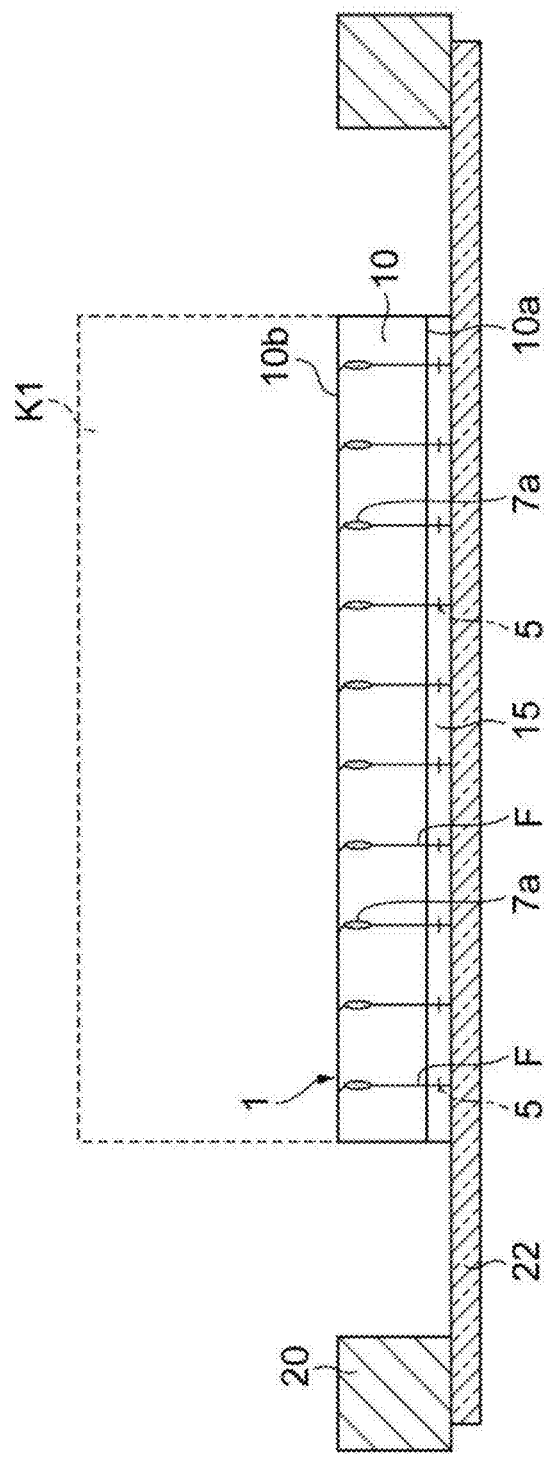
FIG. 20 is a sectional view for explaining the semiconductor chip manufacturing method using the laser processing method of the embodiment.

Subsequently, as illustrated in FIGS. 19 and 20, a predetermined portion K including the back surface 10b and the second modified region 7b in the silicon substrate 10 is removed (third step). Specifically, the back surface 10b of the silicon substrate 10 on which the first modified region 7a located on the front surface 10a side and the second modified region 7b located on the back surface 10b side of the first modified region 7a are formed, are mechanically ground and polished using a grinder or the like. As a result, a predetermined portion K1 including the second modified region 7b and not including the first modified region 7a is removed from the back surface 10b, and the object to be processed 1 is thinned to a predetermined thickness. That is, the back surface 10b of the silicon substrate 10 is polished such that the predetermined portion K1 including the second modified region 7b is removed.

In the object to be processed 1 after polishing, the first modified region 7a remains of the first modified region 7a and the second modified region 7b. In the object to be processed 1 after polishing, only the first modified region 7a and the crack F are included. By removing the predetermined portion K1, the crack F reaches the back surface 10b of the silicon substrate 10 from which the predetermined portion K1 has been removed, and the object to be processed 1 is cut for each functional device. As an example, the silicon substrate 10 is thinned to a thickness of 200 μm.

Figure 21:
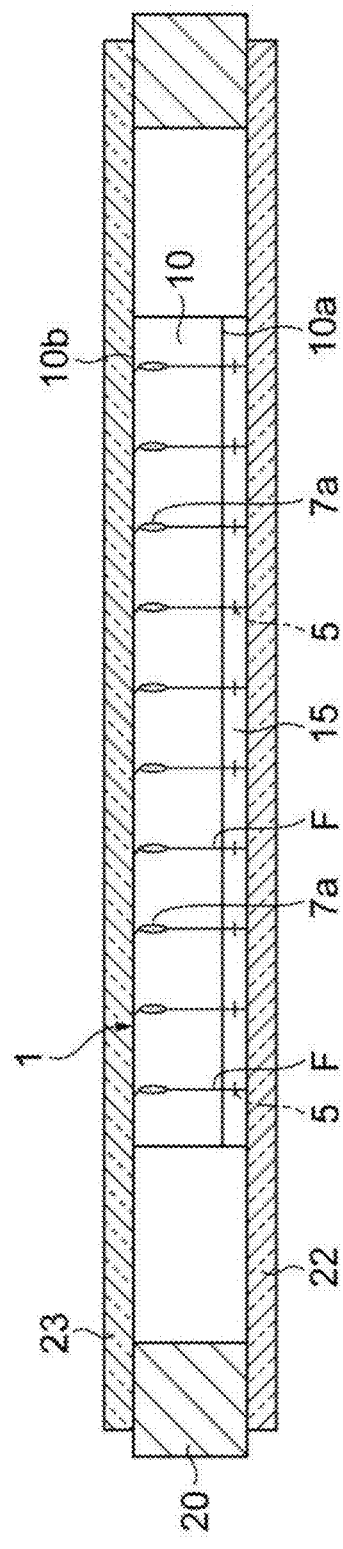
FIG. 21 is a sectional view for explaining the semiconductor chip manufacturing method using the laser processing method of the embodiment.
Figure 22:
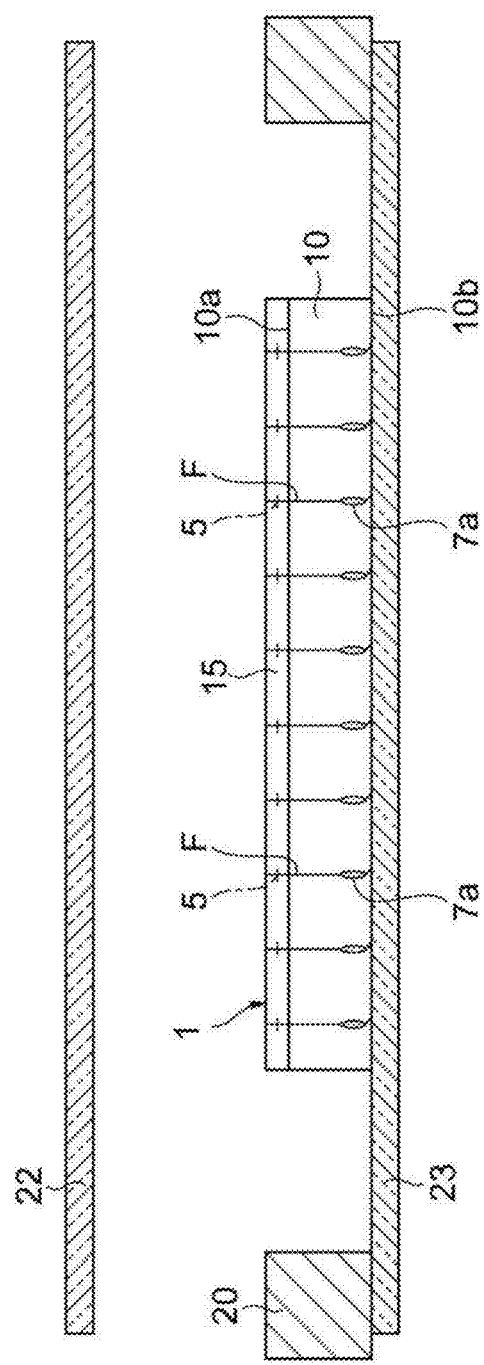
FIG. 22 is a sectional view for explaining the semiconductor chip manufacturing method using the laser processing method of the embodiment.
Figure 23:
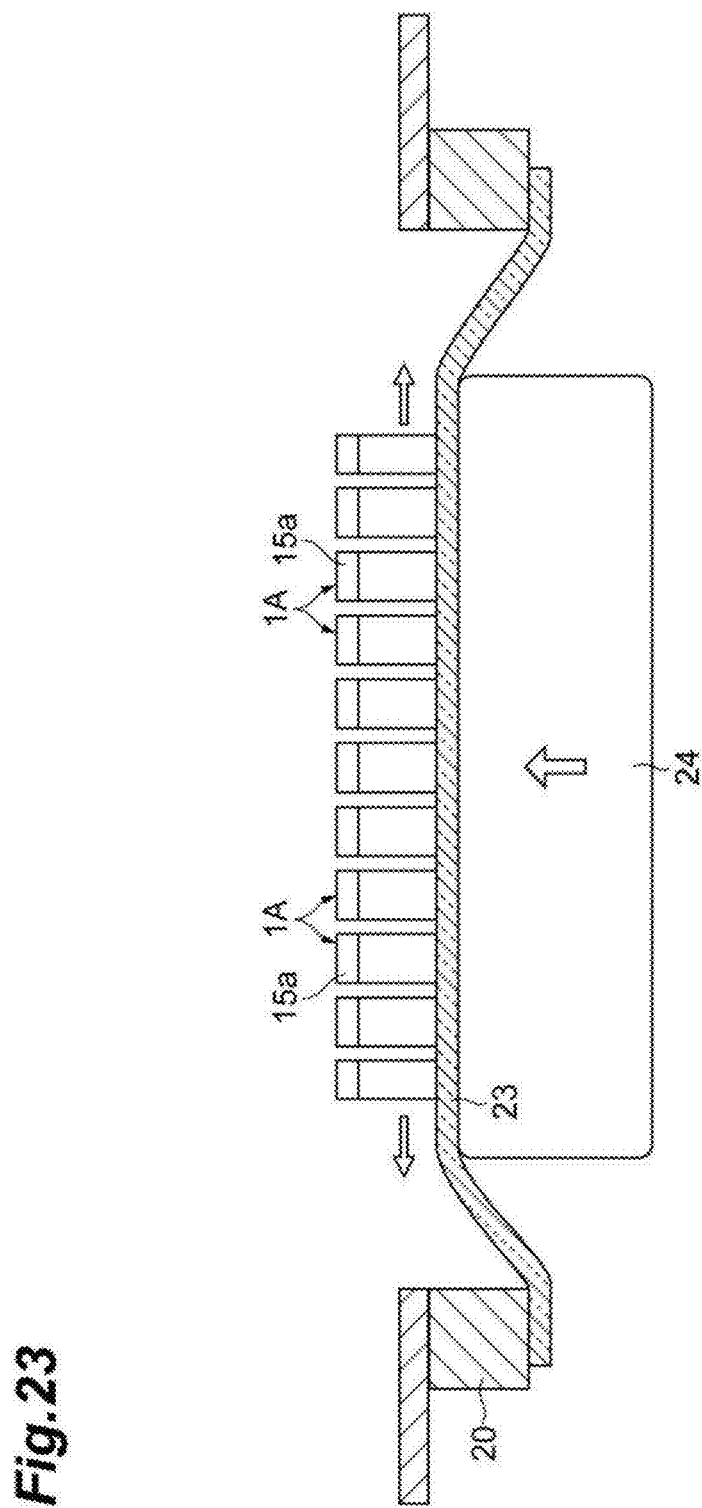
FIG. 23 is a sectional view for explaining the semiconductor chip manufacturing method using the laser processing method of the embodiment.
Figure 24:
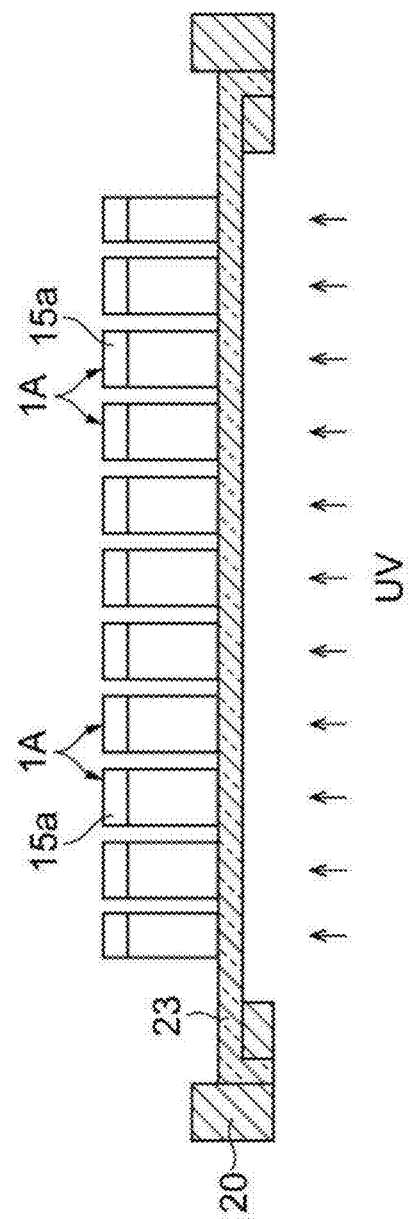
FIG. 24 is a sectional view for explaining the semiconductor chip manufacturing method using the laser processing method of the embodiment.

Subsequently, as illustrated in FIG. 21, an expansion film 23 is pasted to the back surface 10b of the silicon substrate 10 and the holding member 20. As illustrated in FIG. 22, the protective film 22 is removed. As illustrated in FIG. 23, a pressing member 24 is pressed against the expansion film 23 to expand the expansion film 23. As a result, the object to be processed 1 cut for each functional device 15a, that is, a plurality of semiconductor chips 1A is separated from each other. Subsequently, as illustrated in FIG. 24, the expansion film 23 is irradiated with ultraviolet light to lower adhesive force of the expansion film 23. Each of the semiconductor chips 1A is picked up.

As described above, in the laser processing method of the embodiment, the second converging point P2 of the laser light L1 is offset when the second modified region 7b is formed. As a result, it is possible to suppress the occurrence of the splash S on the front surface 3 of the object to be processed 1 on the opposite side to the laser light entrance surface.

By offsetting the second converging point P2, a position of the second modified region 7b in a direction of the offset (vertical direction of the line to cut 5) has a level difference with respect to a position of the first modified region 7a. However, the second modified region 7b is removed along with removal of the predetermined portion K1. Accordingly, in the object to be processed 1 cut along the line to cut 5 after the removal of the predetermined portion K1, it is possible to suppress appearance of the level difference on the cut surface due to the second modified region 7b. It is possible to improve straightness by smoothing the cut surface. It is possible to obtain a satisfactory end surface of each of the semiconductor chips 1A.

In the laser processing method of the embodiment, the silicon substrate 10 is applied as the semiconductor substrate. The laser light L1 has a wavelength greater than 1064 nm. As a result, as compared with the case where the laser light L0 having a wavelength of 1064 nm or less is used, the crack F can be greatly extended in the thickness direction of the silicon substrate 10 from the first modified region 7a and the second modified region 7b along with the formation of the first modified region 7a and the second modified region 7b.

When the laser light L1 having a wavelength of 1099 μm or more and 1342 μm or less is used, the crack F can be more greatly extended in the thickness direction of the silicon substrate 10 from the first modified region 7a and the second modified region 7b along with the formation of the first modified region 7a and the second modified region 7b. In particular, the laser light L1 having a wavelength of 1342 μm can extend the crack F more greatly.

When the offset amount for offsetting the second converging point P2 of the laser light L1 when the second modified region 7b is formed is made 24 μm or less, the crack F can be reliably connected between the first modified region 7a and the second modified region 7b. The crack F can be reliably extended in the thickness direction of the silicon substrate 10 from the first modified region 7a and the second modified region 7b along with the formation of the first modified region 7a and the second modified region 7b. Further, when the offset amount is set to 4 µm or more and 18 µm or less, the crack F can be more reliably connected between the first modified region 7a and the second modified region 7b. The crack F can be more reliably extended in the thickness direction of the silicon substrate 10 from the first modified region 7a and the second modified region 7b. In particular, when the offset amount is set to 6 µm or more and 16 µm or less, suppression of the occurrence of the splash S and connection and extension of the crack F can be achieved in good balance.

In the laser processing method of the embodiment, by forming the second modified region 7b, the crack F extending in the thickness direction of the silicon substrate 10 from the first modified region 7a and the second modified region 7b is caused to reach the front surface 10a. Then, by removing the predetermined portion K1, the crack F is caused to reach the back surface 10b of the silicon substrate 10 from which the predetermined portion K1 has been removed. As a result, the object to be processed 1 can be accurately cut along the line to cut 5.

Figure 25:
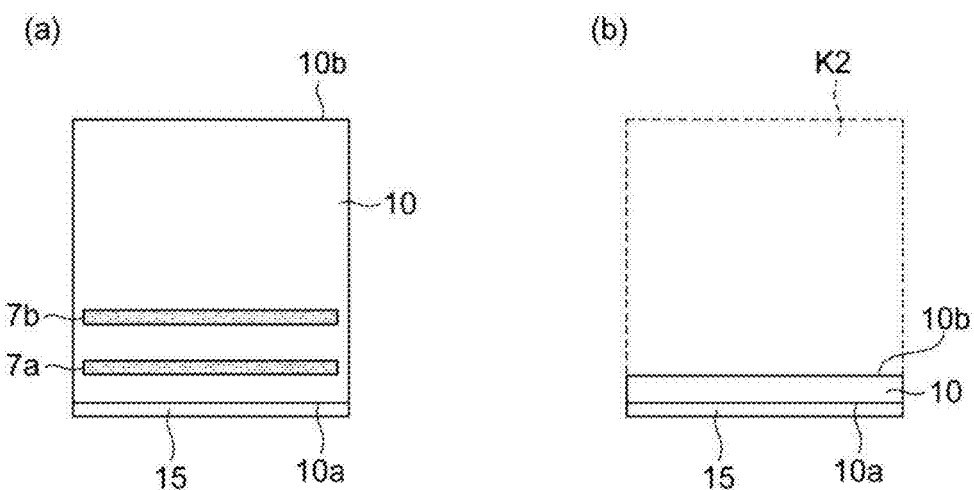
FIG. 25(a) is a sectional view taken along the line to cut of the object to be processed before polishing.
FIG. 25(b) is a sectional view taken along the line to cut of the object to be processed after polishing.

FIG. 25 is a view explaining a laser processing method according to a modification. FIG. 25(a) is a sectional view taken along the line to cut 5 of the object to be processed 1 before polishing. FIG. 25(b) is a sectional view taken along the line to cut 5 of the object to be processed 1 after polishing. As illustrated in FIGS. 25(a) and 25(b), in a case where the back surface 10b of the silicon substrate 10 is polished, a predetermined portion K2 may be removed including the back surface 10b of the silicon substrate 10 and both of the first and second modified regions 7a and 7b. That is, the back surface 10b of the silicon substrate 10 may be polished such that the predetermined portion K2 is removed further including the first modified region 7a with respect to the predetermined portion K1 (see FIG. 20).

As a result, the predetermined portion K2 including the first and second modified regions 7a and 7b is removed from the silicon substrate 10, and the object to be processed 1 is thinned to a predetermined thickness. Neither of the first and second modified regions 7a and 7b remains in the object to be processed 1 after polishing, and only the crack F is included.

In the laser processing method illustrated in FIG. 25, after the first and second modified regions 7a and 7b are formed, not only the second modified region 7b but also the first modified region 7a is removed from the silicon substrate 10. Accordingly, in the object to be processed 1 cut along the line to cut 5 after the removal of the predetermined portion K2, it is also possible to suppress degradation of the straightness of the cut surface due to the first modified region 7a. It is possible to obtain a more satisfactory end surface of each of the semiconductor chips 1A.

In the above, the preferred embodiments have been described; however, the present invention is not limited to the above-described embodiments, and may be modified within the range not changing the gist described in each claim or applied to other things.

For example, when the first modified region 7a is formed, the first converging point P1 of the laser light L1 may be offset in one side in the direction vertical to both the thickness direction of the silicon substrate 10 and the extending direction of the line to cut 5 with respect to the line to cut 5. When the second modified region 7b is formed, the second converging point P2 of the laser light L1 may be offset in the other side in the direction vertical to both the thickness direction of the silicon substrate 10 and the extending direction of the line to cut 5 with respect to the line to cut 5. That is, when the first modified region 7a is formed, while a state is maintained in which the first converging point P1 of the laser light L is away from the line to cut 5 to the one side by a predetermined distance as viewed from the thickness direction of the silicon substrate 10, the first converging point P1 of the laser light L may be moved along the line to cut 5 (parallel to the line to cut 5). When the second modified region 7b is formed, while a state is maintained in which the second converging point P2 of the laser light L is away from the line to cut 5 to the other side by a predetermined distance as viewed from the thickness direction of the silicon substrate 10, the second converging point P2 of the laser light L may be moved along the line to cut 5 (parallel to the line to cut 5). As a result, the first modified region 7a is formed within the silicon substrate 10 along the line to cut 5 (parallel to the line to cut 5) in a state of being away from the line to cut 5 to the one side by the predetermined distance as viewed from the thickness direction of the silicon substrate 10. The second modified region 7b is formed within the silicon substrate 10 along the line to cut 5 (parallel to the line to cut 5) in a state of being away from the line to cut 5 to the other side by the predetermined distance as viewed from the thickness direction of the silicon substrate 10. In this case, the first modified region 7a and the second modified region 7b can be formed in good balance in one side and the other side with respect to the line to cut 5.

The above-described embodiments are not limited to an example in which a step (first step) of forming the first modified region 7a is performed for all the lines to cut 5 set in a grid pattern, and then a step (second step) of forming the second modified region 7b for all the lines to cut 5 set in a grid pattern. As another example, the step (first step) of forming the first modified region 7a and the step (second step) of forming the second modified region 7b may be performed as follows. First, the step (first step) of forming the first modified region 7a is performed for the line to cut 5 extending in a first direction among all the lines to cut 5 set in a grid pattern. Then, the step (second step) of forming the second modified region 7b is performed for the line to cut 5 extending in the first direction. Subsequently, for the line to cut 5 extending in a second direction (direction vertical to the first direction) among all the lines to cut 5 set in a grid pattern, the step (first step) of forming the first modified region 7a is performed. Then, the step (second step) of forming the second modified region 7b is performed for the line to cut 5 extending in the second direction. For the multiple lines to cut 5, for each one line to cut 5, the step (first step) of forming the first modified region 7a is performed. Then, the step (second step) of forming the second modified region 7b may be performed. That is, the step (first step) of forming the first modified region 7a and the step (second step) of forming the second modified region 7b may be performed for one line to cut 5, and the step (first step) of forming the first modified region 7a and the step (second step) of forming the second modified region 7b may be performed for another line to cut 5.

Removal of the predetermined portion K may be implemented by chemical polishing such as etching, instead of or in addition to polishing by mechanical grinding. The predetermined portion K may be removed by various known techniques. In the above-described embodiments, the semiconductor substrate is not limited to the silicon substrate 10 as long as the modified region 7 can be formed by converging the laser light L1. In the above-described embodiments, the wavelength of the laser light L1 is not limited to a wavelength greater than 1064 nm as long as the modified region 7 can be formed by converging the laser light L1.

In the above-described embodiments, by causing the crack F to reach the back surface 10b of the silicon substrate 10 when the predetermined portion K1 is removed, the object to be processed 1 is cut along the line to cut 5. However, instead of or in addition to this, by causing the crack F to reach the back surface 10b of the silicon substrate 10 when the expansion film 23 is expanded to which the silicon substrate 10 is pasted from which the predetermined portion K1 has been removed, the object to be processed 1 may be cut along the line to cut 5.

INDUSTRIAL APPLICABILITY

According to one aspect of the present invention, it is possible to provide a laser processing method capable of suppressing the occurrence of damage on the front surface of the object to be processed on the opposite side to the laser light entrance surface and smoothing the cut surface.

REFERENCE SIGNS LIST

1 . . . object to be processed, 5 . . . line to cut, 7a . . . first modified region, 7b second modified region, 10 . . . silicon substrate (semiconductor substrate), 10a . . . front surface, 10b . . . back surface, 15a . . . functional device, F . . . crack, K1, K2 . . . predetermined portion, L1 . . . laser light, P1 . . . first converging point, P2 . . . second converging point.

The invention claimed is:

1. A laser processing method comprising:
a first step of converging laser light at an object to be processed including a semiconductor substrate formed with a plurality of functional devices on a front surface, with a back surface of the semiconductor substrate as a laser light entrance surface, and while maintaining a distance between the front surface of the semiconductor substrate and a first converging point of the laser light at a first distance, moving the first converging point of the laser light along a line to cut set to pass between the adjacent functional devices, to form a first modified region along the line to cut;
a second step, after the first step, of converging the laser light at the object to be processed, with the back surface of the semiconductor substrate as the laser light entrance surface, and while maintaining a distance between the front surface of the semiconductor substrate and a second converging point at a second distance greater than the first distance, and while offsetting the second converging point of the laser light in a direction vertical to both directions of a thickness direction of the semiconductor substrate and an extending direction of the line to cut with respect to a position at which the first converging point of the laser light is converged, moving the second converging point of the laser light along the line to cut, to form a second modified region along the line to cut; and
a third step, after the second step, of removing a predetermined portion including the back surface and at least the second modified region in the semiconductor substrate.

2. The laser processing method according to claim 1, wherein,
in the third step, the predetermined portion further including the first modified region is removed in the semiconductor substrate.

3. The laser processing method according to claim 2, wherein
the semiconductor substrate is a silicon substrate, and the laser light has a wavelength greater than 1064 nm.

4. The laser processing method according to claim 3, wherein
the laser light has a wavelength of 1099 µm or more and 1342 µm or less.

5. The laser processing method according to claim 2, wherein,
in the second step, by forming the second modified region, a crack extending in the thickness direction of the semiconductor substrate from the first modified region and the second modified region is caused to reach the front surface of the semiconductor substrate, and
in the third step, by removing the predetermined portion, the crack extending in the thickness direction of the semiconductor substrate from the first modified region and the second modified region in the second step is caused to reach the back surface of the semiconductor substrate from which the predetermined portion has been removed.

6. The laser processing method according to claim 1 wherein
the semiconductor substrate is a silicon substrate, and the laser light has a wavelength greater than 1064 nm.

7. The laser processing method according to claim 6, wherein
the laser light has a wavelength of 1099 µm or more and 1342 µm or less.

8. The laser processing method according to claim 7, wherein
a distance by which the second converging point of the laser light is offset in the direction vertical to both directions of the thickness direction of the silicon substrate and the extending direction of the line to cut with respect to the position at which the first converging point of the laser light is converged, is 24 µm or less.

9. The laser processing method according to claim 8, wherein
the distance by which the second converging point of the laser light is offset in the direction vertical to both directions of the thickness direction of the silicon substrate and the extending direction of the line to cut with respect to the position at which the first converging point of the laser light is converged, is 4 µm or more and 18 µm or less.

10. The laser processing method according to claim 7, wherein,
in the second step, by forming the second modified region, a crack extending in the thickness direction of the semiconductor substrate from the first modified region and the second modified region is caused to reach the front surface of the semiconductor substrate, and
in the third step, by removing the predetermined portion, the crack extending in the thickness direction of the semiconductor substrate from the first modified region and the second modified region in the second step is caused to reach the back surface of the semiconductor substrate from which the predetermined portion has been removed.

11. The laser processing method according to claim 6, wherein a distance by which the second converging point of the laser light is offset in the direction vertical to both directions of the thickness direction of the silicon substrate and the extending direction of the line to cut with respect to the position at which the first converging point of the laser light is converged, is 24 µm or less.

12. The laser processing method according to claim 11, wherein the distance by which the second converging point of the laser light is offset in the direction vertical to both directions of the thickness direction of the silicon substrate and the extending direction of the line to cut with respect to the position at which the first converging point of the laser light is converged, is 4 µm or more and 18 µm or less.

13. The laser processing method according to claim 12, wherein, in the second step, by forming the second modified region, a crack extending in the thickness direction of the semiconductor substrate from the first modified region and the second modified region is caused to reach the front surface of the semiconductor substrate, and in the third step, by removing the predetermined portion, the crack extending in the thickness direction of the semiconductor substrate from the first modified region and the second modified region in the second step is caused to reach the back surface of the semiconductor substrate from which the predetermined portion has been removed.

14. The laser processing method according to claim 11, wherein, in the second step, by forming the second modified region, a crack extending in the thickness direction of the semiconductor substrate from the first modified region and the second modified region is caused to reach the front surface of the semiconductor substrate, and in the third step, by removing the predetermined portion, the crack extending in the thickness direction of the semiconductor substrate from the first modified region and the second modified region in the second step is caused to reach the back surface of the semiconductor substrate from which the predetermined portion has been removed.

15. The laser processing method according to claim 6, wherein, in the second step, by forming the second modified region, a crack extending in the thickness direction of the semiconductor substrate from the first modified region and the second modified region is caused to reach the front surface of the semiconductor substrate, and in the third step, by removing the predetermined portion, the crack extending in the thickness direction of the semiconductor substrate from the first modified region and the second modified region in the second step is caused to reach the back surface of the semiconductor substrate from which the predetermined portion has been removed.

16. The laser processing method according to claim 1, wherein, in the second step, by forming the second modified region, a crack extending in the thickness direction of the semiconductor substrate from the first modified region and the second modified region is caused to reach the front surface of the semiconductor substrate, and in the third step, by removing the predetermined portion, the crack extending in the thickness direction of the semiconductor substrate from the first modified region and the second modified region in the second step is caused to reach the back surface of the semiconductor substrate from which the predetermined portion has been removed.

* * * * *